US012666562B2

(12) United States Patent
Horie

(10) Patent No.: US 12,666,562 B2
(45) Date of Patent: Jun. 23, 2026

(54) ELECTRONIC CONTROL DEVICE

(71) Applicant: Hitachi Astemo, Ltd., Hitachinaka (JP)

(72) Inventor: Masao Horie, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 273 days.

(21) Appl. No.: 18/695,984

(22) PCT Filed: Sep. 16, 2022

(86) PCT No.: PCT/JP2022/034846
§ 371 (c)(1),
(2) Date: Mar. 27, 2024

(87) PCT Pub. No.: WO2023/058442
PCT Pub. Date: Apr. 13, 2023

(65) Prior Publication Data
US 2025/0008683 A1      Jan. 2, 2025

(30) Foreign Application Priority Data

Oct. 7, 2021    (JP) ................................. 2021-165399

(51) Int. Cl.
*H05K 7/20*        (2006.01)
*H05K 5/02*        (2006.01)
(52) U.S. Cl.
CPC ....... *H05K 7/20172* (2013.01); *H05K 5/0247* (2013.01); *H05K 7/20145* (2013.01); *H05K 7/20154* (2013.01)
(58) Field of Classification Search
CPC ........... H05K 7/20409; H05K 7/20154; H05K 7/20863; H05K 7/20854; H05K 5/0069;
(Continued)

(56) References Cited

U.S. PATENT DOCUMENTS 5,513,329 A  *  4/1996  Pecone ................. G06F 13/409
                                                                710/301
6,778,390 B2 *  8/2004  Michael ................ H01L 23/467
                                                                361/679.48
(Continued)

FOREIGN PATENT DOCUMENTS

JP        H05-055771 A      3/1993
JP        2016-220500 A     12/2016
WO      WO-2020/174934 A1    9/2020

OTHER PUBLICATIONS

International Search Report with English Translation and Written Opinion of International Patent Application No. PCT/JP2022/034846 dated Dec. 13, 2022 (8 pages).

*Primary Examiner* — Michael A Matey
(74) *Attorney, Agent, or Firm* — Foley & Lardner LLP

(57)        ABSTRACT

Provided is an electronic control device having satisfactory assembly workability capable of efficiently and reliably performing a fitting work of a fan-side connector to a substrate-side connector in a facilitated manner without increasing a number of components or causing a failure, such as a poor fitting (poor electrical connection). The base housing 20 is provided with a wiring passage 30 including a wiring housing groove 31 and a through-hole 35 for routing the fan-side connector 50 with a fan wiring 28 from a front surface side to a back surface side, and provided with a connector holding guide portion 40 to which the fan-side connector 50 after passing through the through-hole 35 is fitted from the back surface side and held. A substrate-side connector 60 disposed at the substrate 12 overlaps with the fan-side connector 50 held by a connector holding guide portion 40 in an orthographic projection perpendicular to the substrate 12, and the fan-side connector 50 is fitted to the substrate-side connector 60 to a required fitting depth.

15 Claims, 28 Drawing Sheets

(58) Field of Classification Search

CPC ...... H05K 7/20172; H05K 1/14; H05K 1/142; H05K 5/006; H05K 5/0247; H05K 7/20145; H05K 5/069; H05K 7/20; H05K 1/181; H05K 1/02; H05K 5/0047; H05K 5/0073; H05K 7/20136; H05K 7/20163; H05K 7/2039; H05K 9/0022; G06F 1/20; H02G 3/081; H02G 3/16; F04D 25/0693

See application file for complete search history.

(56) References Cited

U.S. PATENT DOCUMENTS

| | | | | |
|---|---|---|---|---|
| 10,485,136 | B2 * | 11/2019 | Gopalakrishna | G06F 1/181 |
| 12,399,539 | B2 * | 8/2025 | Lee | G06F 1/1658 |
| 2007/0047201 | A1 * | 3/2007 | Yu | F04D 25/0613 |
| | | | | 361/695 |
| 2007/0121292 | A1 * | 5/2007 | Ariga | G06F 1/203 |
| | | | | 361/695 |
| 2007/0217910 | A1 * | 9/2007 | Chang | H05K 7/20172 |
| | | | | 415/213.1 |
| 2008/0124234 | A1 * | 5/2008 | Echazarreta | F04D 25/08 |
| | | | | 361/695 |
| 2009/0244845 | A1 * | 10/2009 | Nagamoto | H05K 7/20918 |
| | | | | 361/697 |
| 2010/0014250 | A1 * | 1/2010 | Kitahara | A61B 8/12 |
| | | | | 165/122 |
| 2010/0254084 | A1 * | 10/2010 | Chen | F04D 25/0633 |
| | | | | 361/695 |
| 2012/0262944 | A1 * | 10/2012 | Ohno | G02B 6/0083 |
| | | | | 362/611 |
| 2013/0064650 | A1 * | 3/2013 | Wang | G06F 1/20 |
| | | | | 415/182.1 |
| 2016/0352215 | A1 | 12/2016 | Momose | |
| 2016/0366791 | A1 * | 12/2016 | Huang | H05K 7/20172 |
| 2018/0100512 | A1 * | 4/2018 | Chen | F04D 25/08 |
| 2018/0279513 | A1 * | 9/2018 | Tabuchi | G11B 33/142 |
| 2019/0182982 | A1 * | 6/2019 | Gopalakrishna | H05K 7/20172 |
| 2021/0161031 | A1 * | 5/2021 | Wang | F04D 25/0613 |
| 2022/0007539 | A1 * | 1/2022 | Horie | H05K 7/20409 |
| 2022/0225543 | A1 * | 7/2022 | Lo | H05K 7/20727 |
| 2022/0346267 | A1 * | 10/2022 | Kawakita | H05K 7/20409 |
| 2023/0178942 | A1 * | 6/2023 | Liang | F04D 29/522 |
| | | | | 439/529 |
| 2023/0232589 | A1 * | 7/2023 | Sugahara | H05K 7/20154 |
| | | | | 361/697 |
| 2023/0327381 | A1 * | 10/2023 | Sun | F04D 29/522 |
| 2024/0414877 | A1 * | 12/2024 | Tseng | H05K 7/20172 |
| 2024/0414896 | A1 * | 12/2024 | Chuang | G06F 1/189 |
| 2025/0122885 | A1 * | 4/2025 | Lu | F04D 29/601 |
| 2025/0240934 | A1 * | 7/2025 | Teranishi | H01L 23/467 |
| 2025/0271906 | A1 * | 8/2025 | Lee | F04D 17/16 |

* cited by examiner

Cross Section along A-A of Fig. 3

Cross Section along C-C of Fig. 5

Fig. 12

Cross Section along E-E of Fig. 12

Fig. 15B

Cross Section along G-G of Fig. 22

ELECTRONIC CONTROL DEVICE

TECHNICAL FIELD

The present invention relates to an electronic control device.

BACKGROUND ART

On-vehicle electronic control devices used for autonomous vehicles are required to perform high-speed calculations and high-speed processing in order to achieve an advanced autonomous driving function as the autonomous driving level is improved. The improved performance of microcomputers supporting the high-speed calculations and the high-speed processing increases heat generation amounts of electronic components including a microprocessor and the like mounted on a control board, and accordingly, forced cooling is necessary. Therefore, it is considered to provide a heat radiating fin and an air cooling fan to send a cooling air to the heat radiating fin in a base housing. However, to deal with a structure to suppress mixing of foreign substances (contamination) into a control board from the air cooling fan via wirings, and the increase in quantity due to the spread of autonomous driving devices, a structure having satisfactory assembly workability without increase in number of components is desired.

WO 2020/174934 (Patent Literature 1) discloses an electronic control device that includes a radiating fin and an air cooling fan in a housing that houses a control board. In the electronic control device, a cover that covers a wall portion surrounding a wiring of the air cooling fan and a wiring path presses the wiring to suppress mixing of foreign substances (contamination) into the control board.

CITATION LIST

Patent Literature

Patent Literature 1: WO 2020/174934

SUMMARY OF INVENTION

Technical Problem

When the air cooling fan (hereinafter simply referred to as a fan in some cases) and the like are disposed in the base housing as described above, to electrically connecting the fan to the substrate, the electronic control device needs a fan wiring including a predetermined number of (usually, 3 to 4) lead wires, a fan-side connector mounted to a distal end side of the fan wirings, and a substrate-side connector to which the fan-side connector is fitted. Furthermore, a wiring passage provided with a wiring housing groove, a through-hole, and the like needs to be provided to the base housing for routing the fan wiring from the fan to the substrate side. Further, in the assembly of the electronic control device, it is necessary to fit the fan-side connector to the substrate-side connector before assembling the substrate to the base housing.

Patent Literature 1 discloses a measure to suppress mixing of foreign substances (contamination) into the control board, positioning of the fan-side connector, but does not disclose the shape of the through-hole through which the fan-side connector passes, or the like, and does not disclose a structure intending the improvement of workability in passing the fan wiring through the base housing to connect the fan wiring to the substrate.

The present invention is made in consideration of the above-described circumstances, and it is an object of the present invention to provide an electronic control device having satisfactory assembly workability capable of efficiently and reliably performing a fitting work of a fan-side connector to a substrate-side connector in a facilitated manner without increasing a number of components or causing a failure, such as a poor fitting (poor electrical connection).

Solution to Problem

To achieve the above-described object, an electronic control device according to the present invention basically comprises: a substrate including a heat generating electronic component; a base housing to which the substrate is positioned and secured; a fin provided at an opposite surface of a surface opposed to the heat generating electronic component of the base housing; a blower disposed at the base housing to send a cooling air to the fin; a blower wiring that electrically connects the blower to the substrate; and a cover that covers at least a part exposed from the base housing of the blower wiring. The blower wiring has a distal end portion provided with a blower-side connector, and the substrate is provided with a substrate-side connector fitted to the blower-side connector. The base housing is provided with a wiring passage including a wiring housing groove and a through-hole for routing the blower-side connector with the blower wiring from a front surface side to a back surface side, the base housing is provided with a connector holding guide portion to which the blower-side connector after passing through the through-hole is fitted from the back surface side and held. In a state where the substrate is positioned to the base housing, the substrate-side connector disposed at the substrate overlaps with the blower-side connector held by the connector holding guide portion in an orthographic projection perpendicular to the substrate, and in a state where the substrate is secured to the base housing, the blower-side connector is fitted to the substrate-side connector to a required fitting depth.

Advantageous Effects of Invention

In the electronic control device of the present invention, when the substrate is positioned and secured to the base housing, simultaneously with it, fitting and electrical connection of the substrate-side connector to the blower-side connector are performed. Therefore, the fitting work of the fan-side connector to the substrate-side connector can be efficiently and reliably performed in a facilitated manner without increasing the number of components or causing a failure, such as a poor fitting (poor electrical connection). Consequently, the improvement of the assembly workability, the labor-saving, the cost reduction, and the like can be effectively attempted.

Problems, configurations, and effects other than ones described above will be clarified in the following embodiments.

BRIEF DESCRIPTION OF DRAWINGS

FIG. 12 is an enlarged view of a part corresponding to a part D of FIG. 5 for describing, for example, a relation between the connector holding guide portion and the fan-side connector in the electronic control device illustrated in FIG. 1.

FIG. 15B is a cross-sectional view for describing a modification (No. 2) in which the substrate is configured to be pressed until the fan-side connector is reliably fitted to the substrate-side connector.

DESCRIPTION OF EMBODIMENTS

Figure 1:
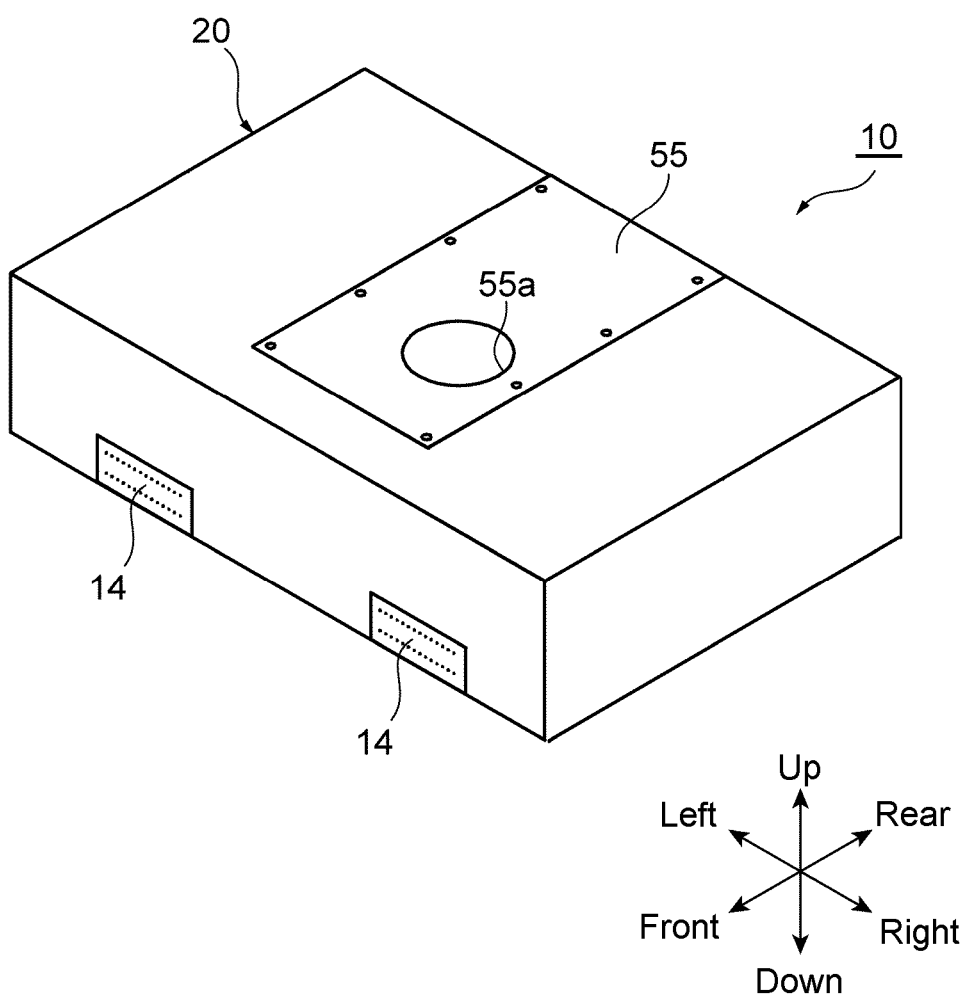
FIG. 1 is a schematic external perspective view illustrating one embodiment of an electronic control device according to the present invention.

The following describes embodiments of the present invention with reference to the drawings.

FIG. 1, FIG. 2, FIG. 3, and FIG. 4 are a schematic external perspective view, a schematic exploded perspective view, an enlarged plan view of a main part in a state where a cover is removed, and an exploded perspective view of the main part in a state where a fan and its wiring are extracted, respectively illustrating one embodiment of an electronic control device according to the present invention. In this Description, descriptions indicating positions and directions, such as up and down, right and left, and front and rear, are given to avoid complicated explanations for convenience according to the drawings, and not necessarily indicate the positions and the directions in a state of actually mounted to a vehicle.

An electronic control device 10 illustrated in the drawing is assumed to be, for example, a vehicle control device mounted to a vehicle (not illustrated) to control respective units of the vehicle, but may be used in other purposes.

The electronic control device 10 illustrated in the drawing basically has a box shape (rectangular parallelepiped shape) including a wiring substrate (hereinafter simply referred to as a substrate in some cases) 12 having a rectangular flat plate shape, a base housing 20 to which the wiring substrate 12 is positioned and assembled to be secured, and a bottom plate (not illustrated) assemble to a lower side of the wiring substrate 12. The base housing 20 is made of a metal material having a high thermal conductivity by aluminum die casting or the like here, but the material is not limited thereto. The wiring substrate 12 is made of an organic material, such as an epoxy resin. The wiring substrate 12 may be a single layer substrate, and may be a multi-layer substrate.

The substrate 12 includes connectors 14, 14 for transmitting and receiving a signal with an outside (vehicle), and although not illustrated, various electronic components with heat generating electronic components that generate high heat and the like, for example, a microprocessor constituting a main part of a microcomputer, are mounted to the substrate 12. At a predetermined position of the substrate 12, a substrate-side connector 60 to electrically connect an air cooling fan 25 described later to the substrate 12 is provided.

Figure 2:
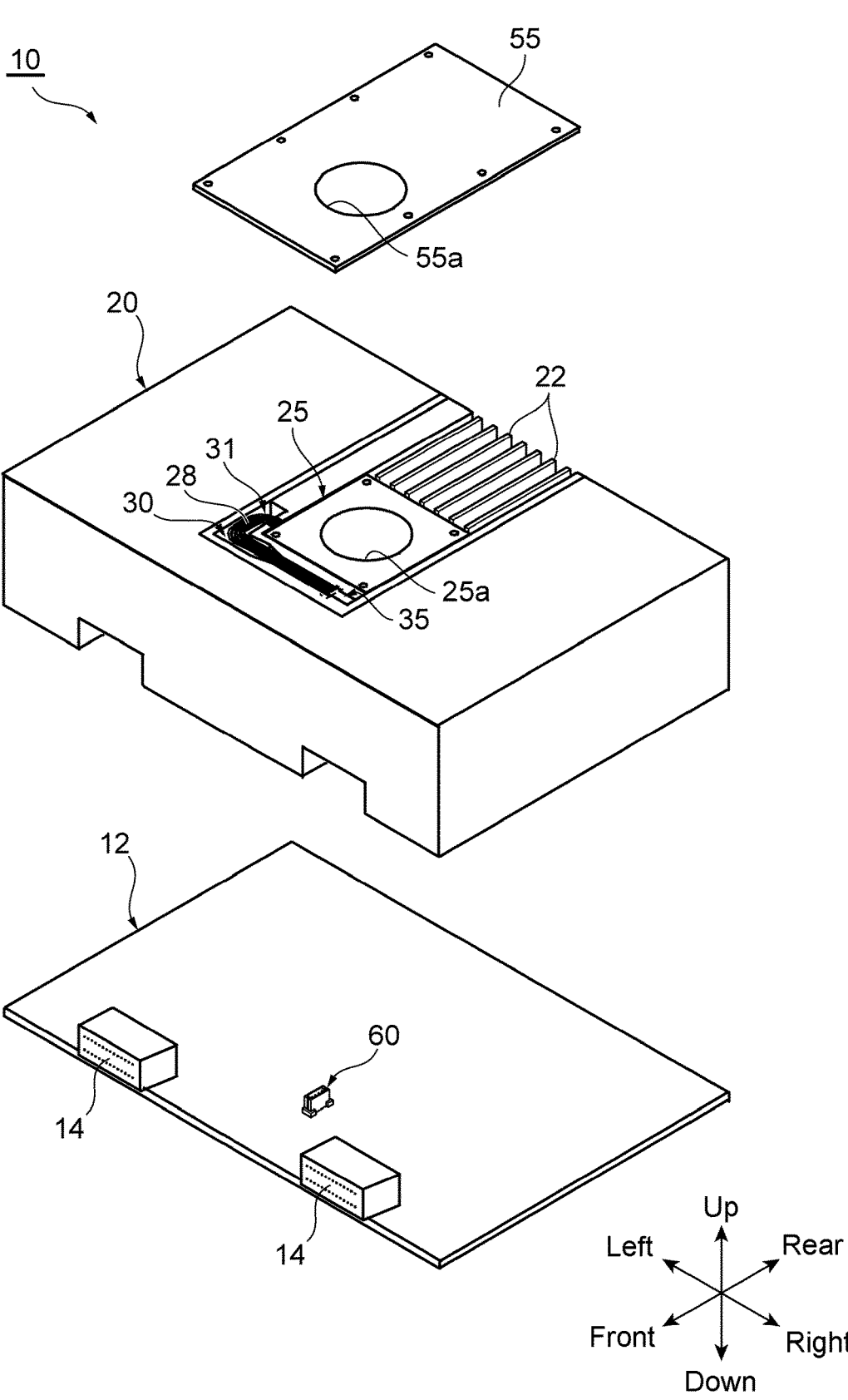
FIG. 2 is a schematic exploded perspective view of the electronic control device illustrated in FIG. 1.
Figure 3:
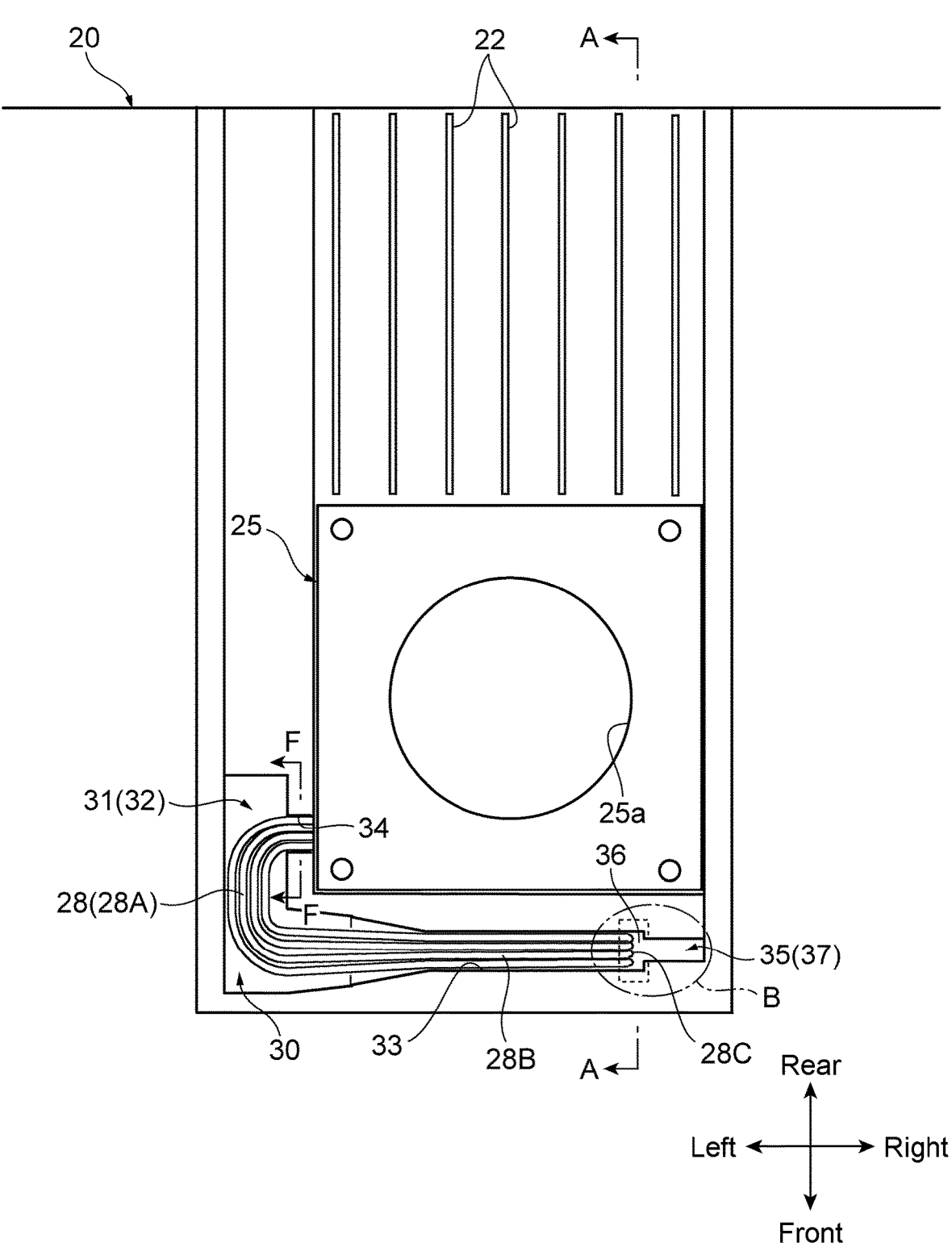
FIG. 3 is an enlarged plan view of a main part of the electronic control device illustrated in FIG. 1 in a state where a cover is removed.
Figure 4:
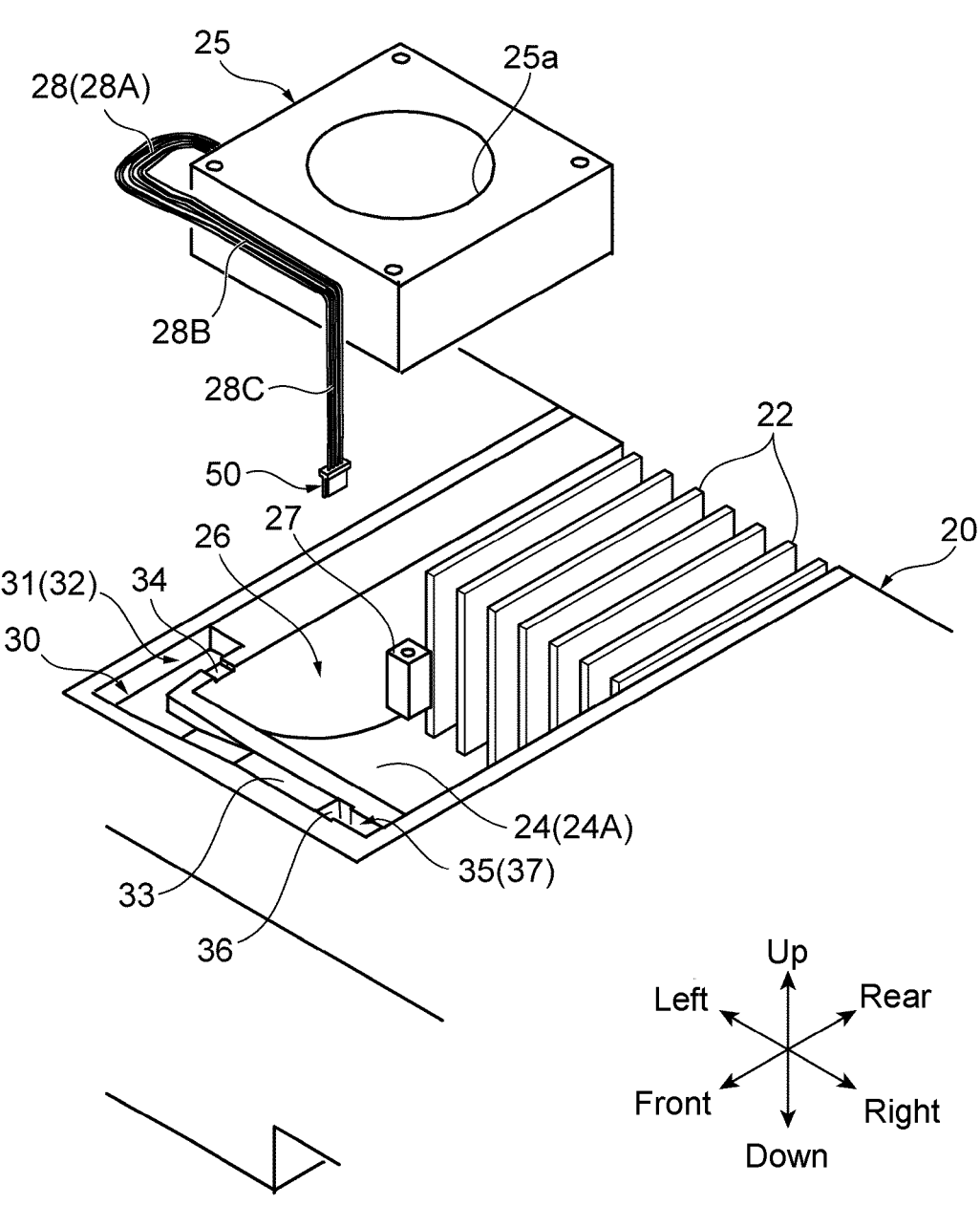
FIG. 4 is an exploded perspective view of the main part of the electronic control device illustrated in FIG. 2 in a state where a fan and its wiring are extracted.
Figure 5:
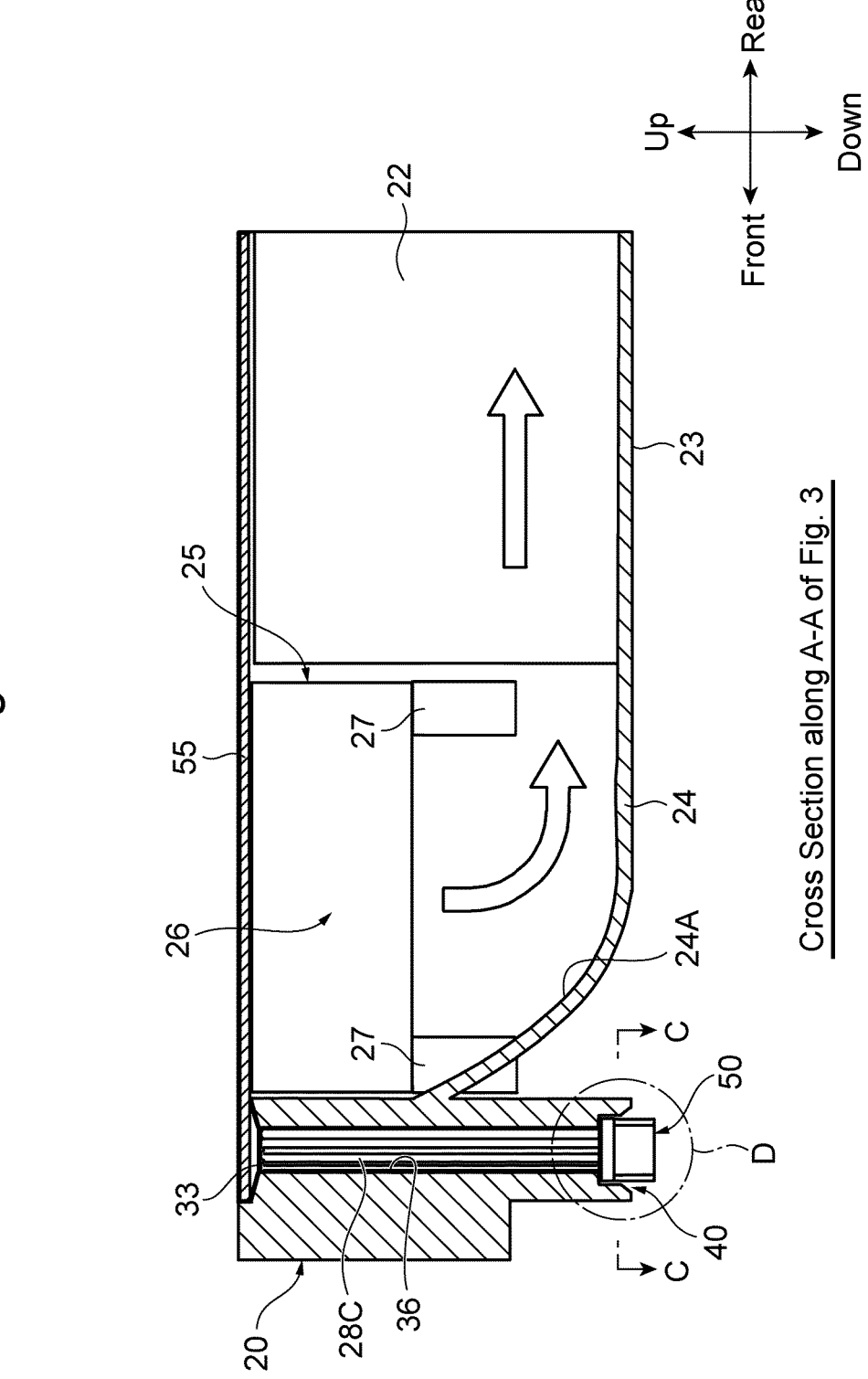
FIG. 5 is a cross-sectional view along an arrow line A-A of FIG. 3.

As seen well from FIG. 2 to FIG. 4, and additionally FIG. 5, the base housing 20 is provided with a fin standing portion 23 at a part positioned immediately above the heat generating electronic component that generates high heat located at a lower surface side of the base housing 20 at the center in a right-left direction. In the fin standing portion 23, rectangular heat radiating fins (hereinafter simply referred to as fins in some cases) 22 are disposed upright at predetermined intervals in the right-left direction. In other words, the heat radiating fins 22 are located to an opposite surface of a surface opposed to the heat generating electronic component of the base housing 20.

At a front part near the heat radiating fins 22 of the base housing 20, a fan arrangement space 26 (FIG. 4, FIG. 5) is formed, and four corners of a rectangular air cooling fan (hereinafter simply referred to as a fan in some cases) 25 as a blower are secured to four support pillars 27 provided at the fan arrangement space 26 with screws. As the air cooling fan 25, here, an axial fan that suctions air from an air suction opening 25a at an upper end surface portion and discharges the air directly below is used. As illustrated in FIG. 5, the air discharged directly below from the air cooling fan 25 is sent in an airflow direction changed to a direct lateral direction by a lower surface portion 24 with an inclined surface portion 24A consecutively provided to the fin standing portion 23, and most of the air is discharged to a rear side passing through a lower portion of the heat radiating fins 22 that become high temperature (void arrow of FIG. 5). While the axial fan is used as the blower that sends a cooling air to the heat radiating fins 22 in this embodiment, a fan of another type, for example, a centrifugal fan may be used, and a blower other than a fan without a rotary vane may be used.

Then, the electronic control device 10 of this embodiment includes a fan-side connector (blower-side connector) 50 and a substrate-side connector 60 to electrically connect the air cooling fan 25 to the substrate 12. The fan-side connector (blower-side connector) 50 is disposed at a distal end portion of a fan wiring (blower wiring) 28 having a base end portion connected to the fan 25 and including a predetermined number of (in this example, four) lead wires. The substrate-side connector 60 is disposed at the substrate 12, and the fan-side connector 50 is fitted to the substrate-side connector 60.

The base housing 20 is provided with a wiring passage 30 and a connector holding guide portion 40. The wiring passage 30 is for routing the fan-side connector 50 with the fan wiring 28 from a front surface side to a back surface side (substrate 12 side), and is provided with a wiring housing groove 31 (32, 33) and a through-hole 35 (36, 37). The fan-side connector 50 after passing through the through-hole 35 is fitted to the connector holding guide portion 40 from a back surface side (lower side) and held by the connector holding guide portion 40.

Figure 6A:
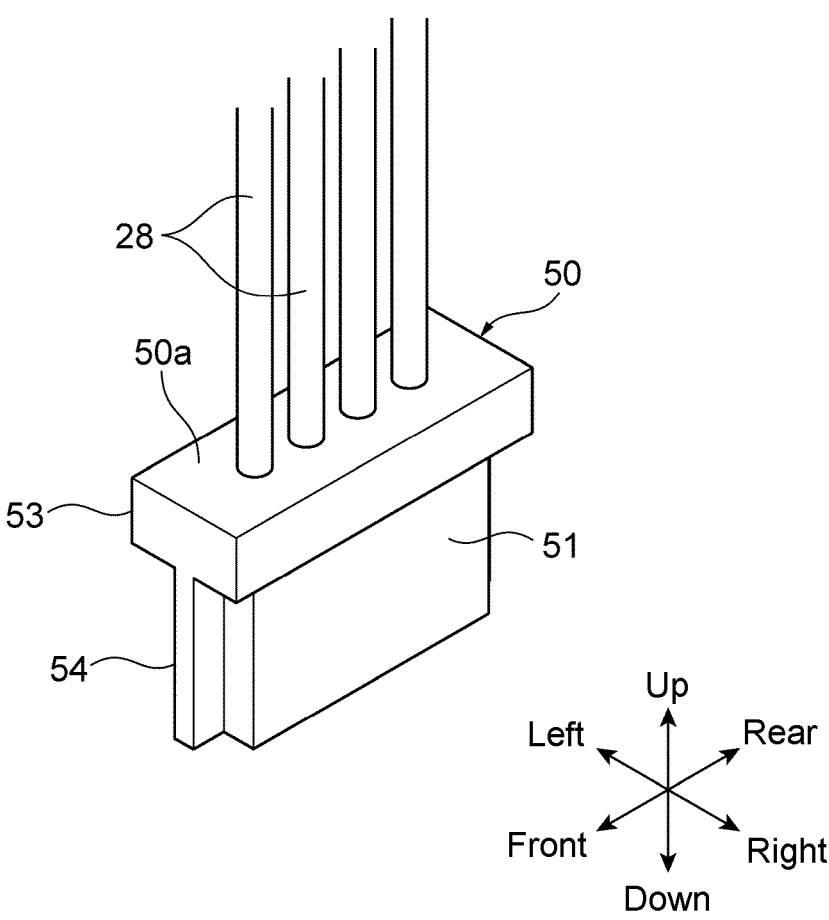
FIG. 6A is a perspective view of a fan-side connector used in the electronic control device illustrated in FIG. 1.
Figure 6B:
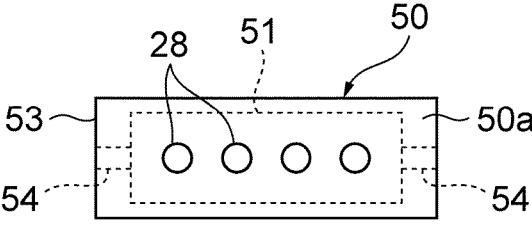
FIG. 6B is four orthogonal views of the fan-side connector used in the electronic control device illustrated in FIG. 1.
Figure 6B:
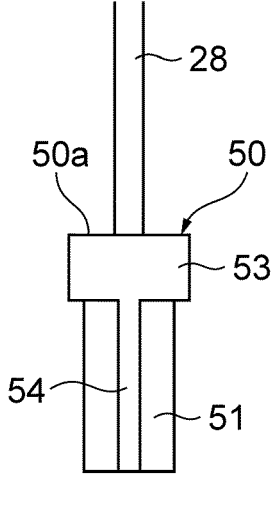
Figure 6B:
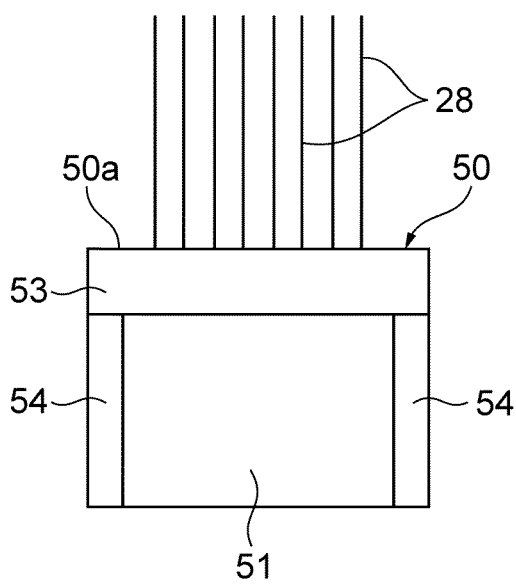
Figure 6B:
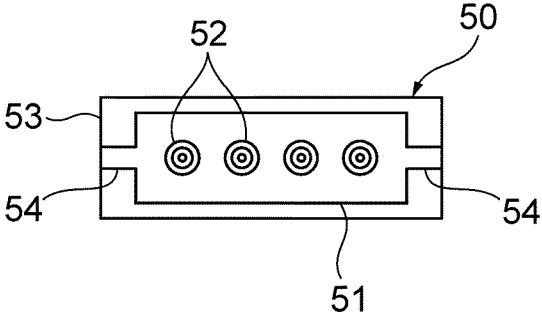
Figure 8A:
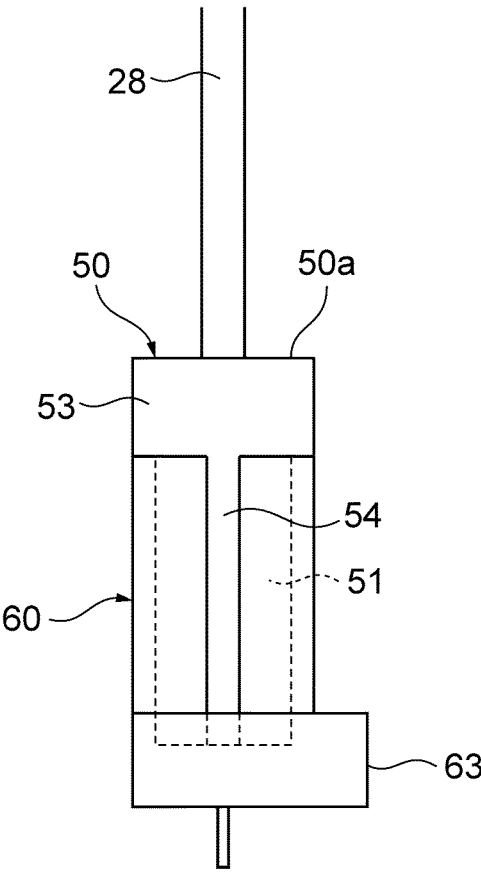
FIG. 8A is a front view illustrating a fitting state of the fan-side connector to the substrate-side connector used in the electronic control device illustrated in FIG. 1.
Figure 8B:
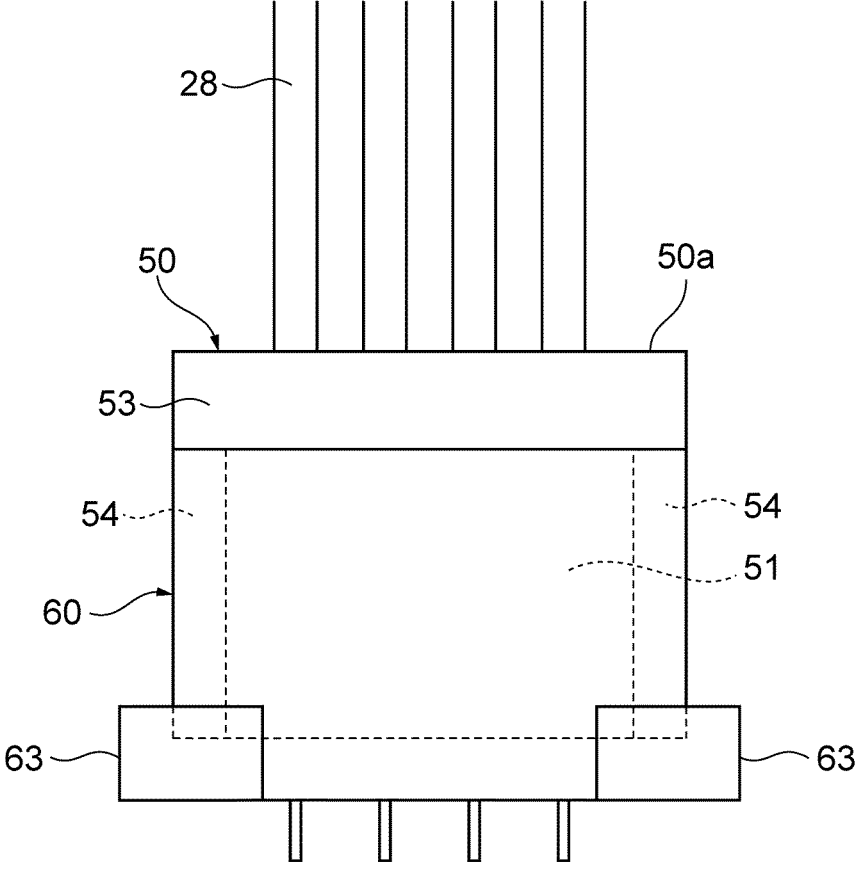
FIG. 8B is a side view illustrating the fitting state of the fan-side connector to the substrate-side connector used in the electronic control device illustrated in FIG. 1.

In detail, the fan-side connector 50 has a rectangular outer shape in plan view that is long in a front-rear direction and short in the right-left direction as illustrated in the perspective view and the four orthogonal views of FIG. 6A and FIG. 6B, and the front view and the side view of the fitting state to the substrate-side connector 60 of FIG. 8A and FIG. 8B. The fan-side connector 50 includes a rectangular housing 51 in which contact members (sockets) 52, to which the predetermined number of (four) lead wires are connected, are disposed side by side. A rectangular flange portion (also referred to as a shoulder portion) 53 projecting outward is provided at an upper portion of the housing 51, and ridge portions 54 extending in an up-down direction (a depth direction of the connector holding guide portion 40) are provided at both front and rear side surfaces of the housing 51 in a lower side with respect to the flange portion 53.

Figure 7A:
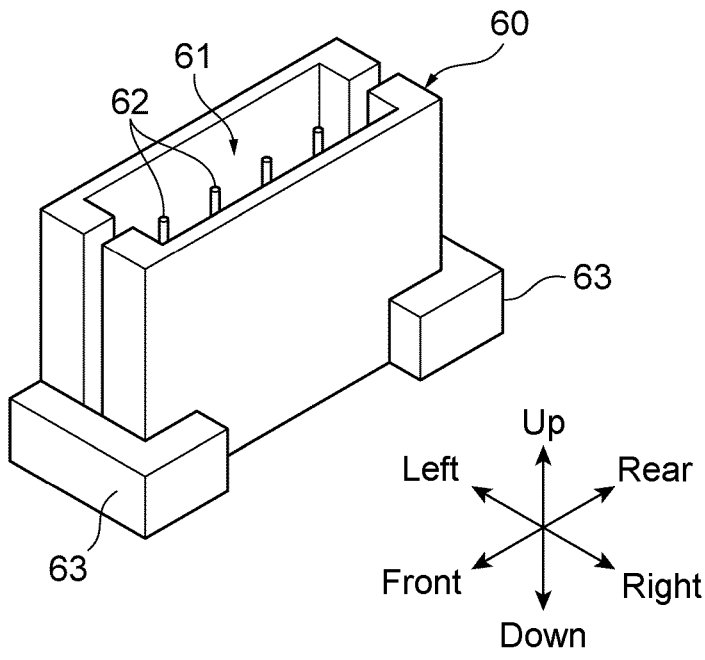
FIG. 7A is a perspective view of a substrate-side connector used in the electronic control device illustrated in FIG. 1.
Figure 7B:
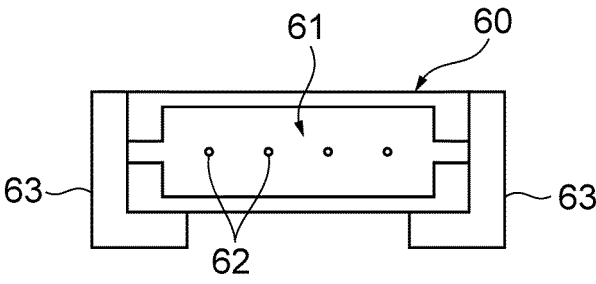
FIG. 7B is three orthogonal views of the substrate-side connector used in the electronic control device illustrated in FIG. 1.
Figure 7B:
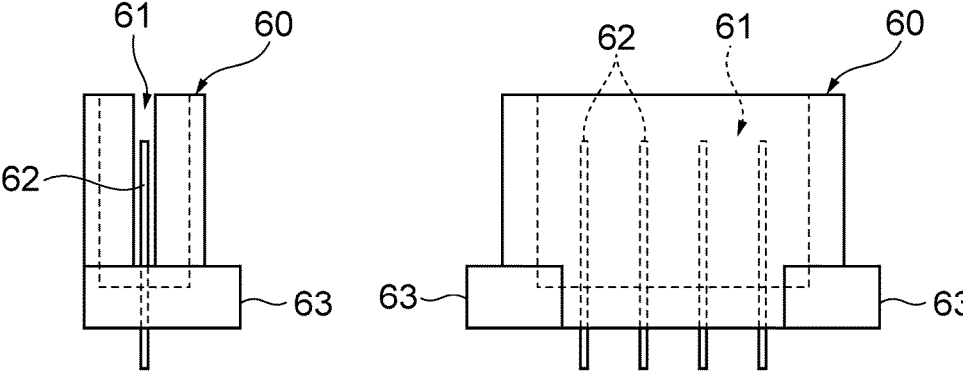

On the other hand, the substrate-side connector 60 has a rectangular outer shape in plan view that is long in the front-rear direction as illustrated in the perspective view and the three orthogonal views of FIG. 7A and FIG. 7B, and the front view and the side view of the fitting state to the fan-side connector 50 of FIG. 8A and FIG. 8B. The substrate-side connector 60 is provided with a recess 61 to which the housing 51 and the ridge portions 54 of the fan-side connector 50 are fitted in an upper surface side, and provided with (a pair of) flange portions 63 projecting outward and having an L shape in plan view at front and rear, and a part of side portions in a lower surface side. The recess 61 has a depth (height) approximately same as heights of the housing 51 and the ridge portion 54. At the recess 61, four contact members (pins) 62, which are inserted into the contact members (sockets) 52 of the fan-side connector 50 to be electrically contacted, are disposed upright side by side.

The wiring housing groove 31 of the wiring passage 30 includes a base end side housing groove 32 and a wiring rectification groove 33. The base end side housing groove 32 houses (a base end side loose portion 28A of) the fan wiring 28 coming out from a wiring outlet portion 34 for the fan 25, and has a relatively deep L shape in plan view. The wiring rectification groove 33 extends in the right-left direction continuously with the base end side housing groove 32, and is relatively shallow. The wiring rectification groove 33 has a bottom surface on which the predetermined number of (four) lead wires constituting the fan wiring 28 are adjacently aligned to form a flat strip-shaped wiring portion 28B. In other words, the wiring rectification groove 33 has a width (in the front-rear direction) approximately same as a width (in the front-rear direction) of the predetermined number of (four) lead wires constituting the fan wiring 28 aligned side by side, that is, a width of a sum of widths (diameters) of the predetermined number of (four) lead wires.

Figure 9:
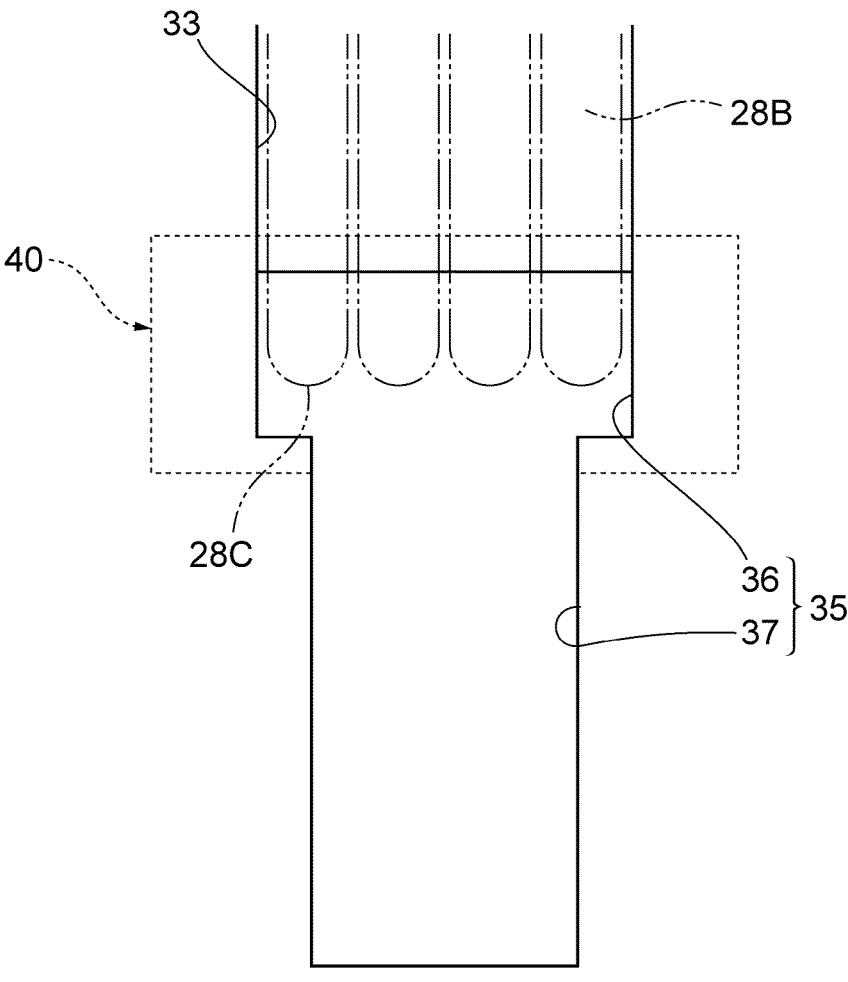
FIG. 9 is an enlarged view of a part B of FIG. 3.

The through-hole 35 of the wiring passage 30 includes a wiring through-hole 36 and a connector through-hole 37. The wiring through-hole 36 is provided at a distal end side of the wiring rectification groove 33, and has a long side approximately same as a width of the strip-shaped wiring portion 28B. The connector through-hole 37 is provided to be continuous with the wiring through-hole 36. The wiring through-hole 36 and the connector through-hole 37 form a T shape in plan view as illustrated in FIG. 9. The connector through-hole 37 has a short side shorter than the long side of the wiring through-hole 36 but longer than a length of the fan-side connector 50 in the front-rear direction, and has a long side slightly longer than a length of the fan-side connector 50 in the right-left direction. Therefore, the fan-side connector 50 can pass through the connector through-hole 37 sideways in the up-down direction (details will be described later).

In other words, the through-hole 35 of the wiring passage 30 has a T-shaped hole shape in plan view, a lateral bar part (in the drawing, a part extending in the front-rear direction)

is the wiring through-hole 36 having the width approximately same as that of the strip-shaped wiring portion 28B, and a longitudinal bar part (in the drawing, a part extending in the right-left direction) is the connector through-hole 37 having a shape shorter (in front-rear dimension) than the lateral bar part of the wiring through-hole 36 but longer in the front-rear direction than the length of the fan-side connector 50 to allow the fan-side connector 50 to pass through the connector through-hole 37.

The fan wiring 28 includes the base end side loose portion 28A with a backlash (excessive length) housed in the base end side housing groove 32, the strip-shaped wiring portion 28B rectified by the wiring rectification groove 33, and a strip-shaped hanging portion 28C passing through the wiring through-hole 36 downward. The strip-shaped hanging portion 28C is provided with the fan-side connector 50 at a distal end portion (lower end portion).

Figure 10:
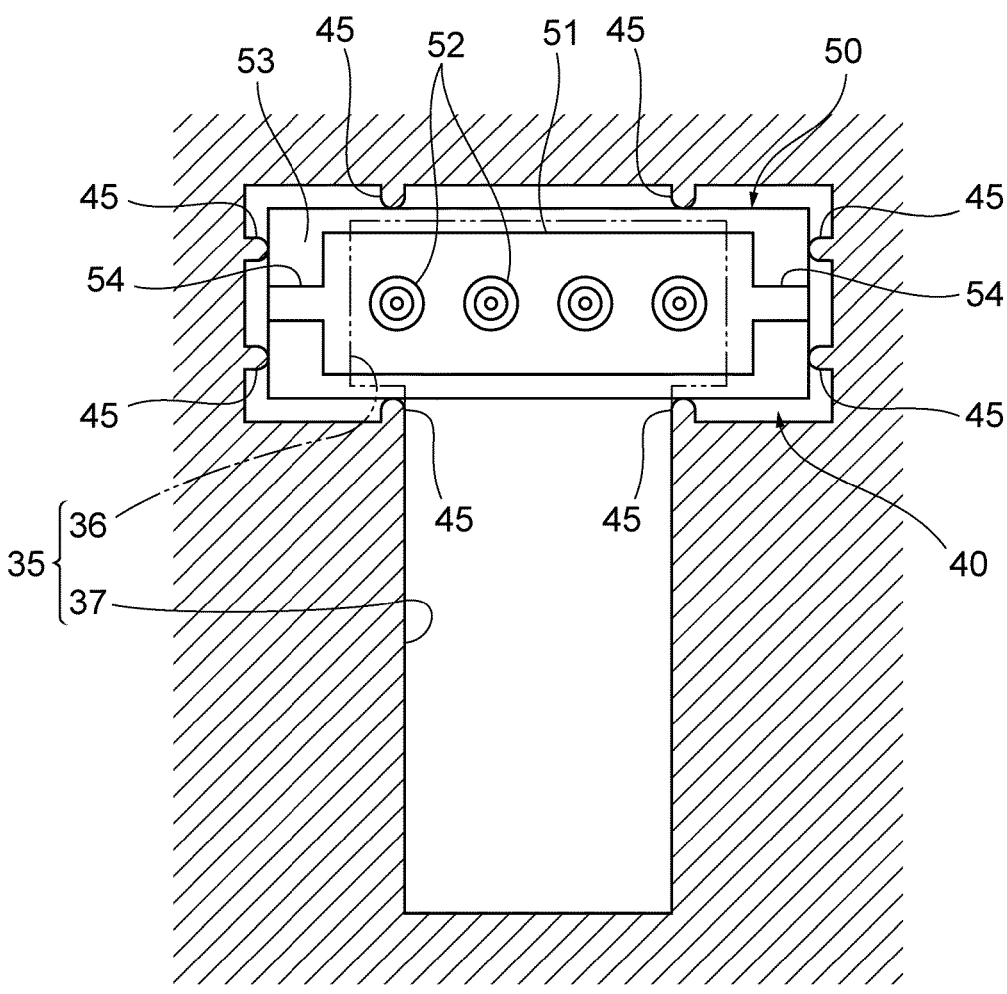
FIG. 10 is an enlarged cross-sectional view along an arrow line C-C of FIG. 5 (for the connector, non-cross section).
Figure 12:
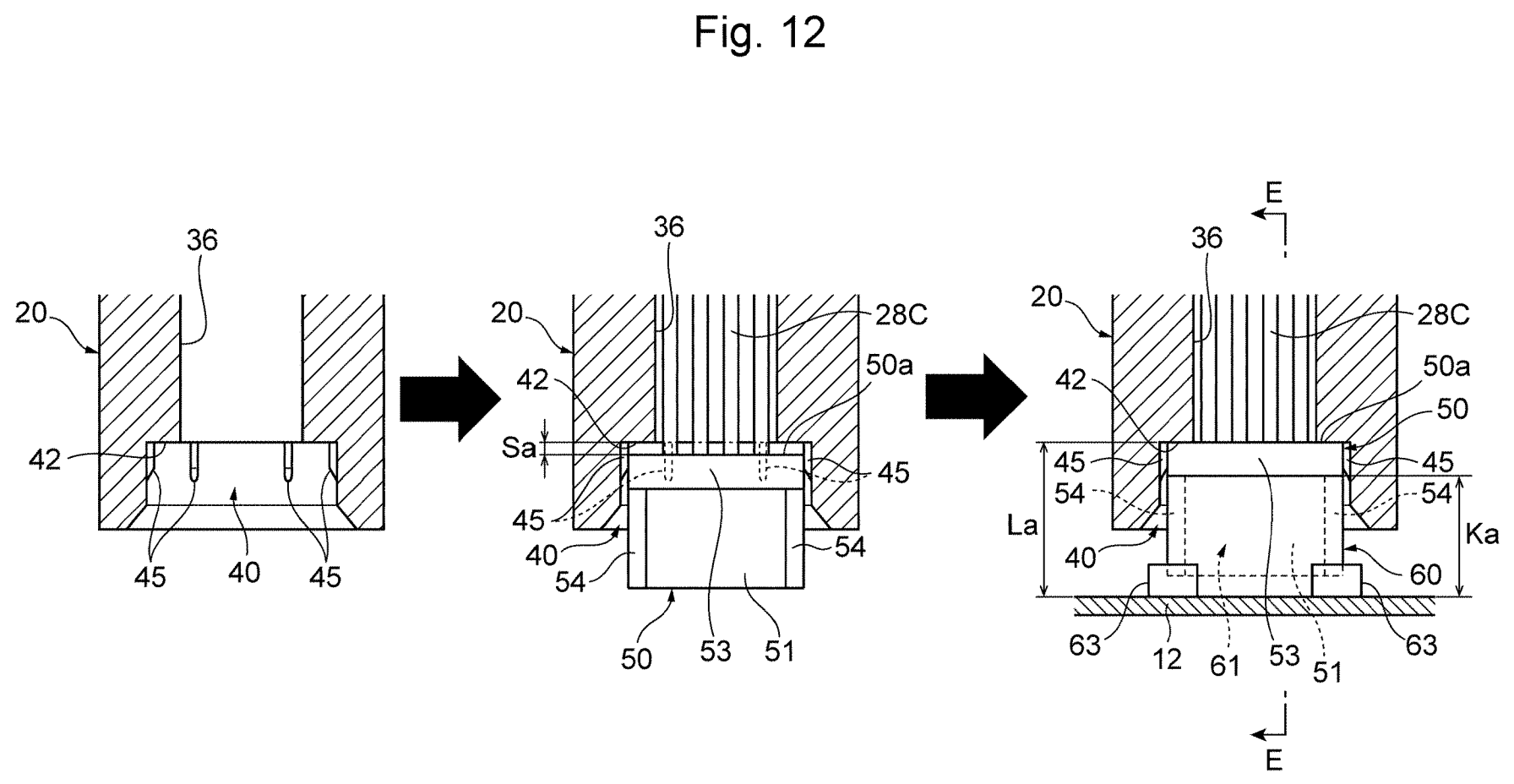

The connector holding guide portion 40 is provided to be continuous with a lower end portion of the through-hole 35 (wiring through-hole 36), and is configured of a hole with a ceiling surface 42 having a rectangular lateral cross section and an open lower face. As illustrated in FIG. 10 and FIG. 12 (especially, left diagram), rib-shaped protrusions 45 are provided to protrude at four inner surfaces (in the ceiling surface 42 side) of the connector holding guide portion 40 so as to be each brought in pressure contact with an outer surface of the upper portion (flange portion 53) of the fan-side connector 50 when the fan-side connector 50 is fitted. The rib-shaped protrusions 45 extend in a depth direction of the connector holding guide portion 40, and the two rib-shaped protrusions 45 are provided at each of the four inner surfaces, thus the eight rib-shaped protrusions 45 in total are symmetrically arranged front and rear, and right and left. When the fan-side connector 50 is fitted from the lower face side of the connector holding guide portion 40, the fan-side connector 50 is held in a posture perpendicular to the substrate 12 to be assembled and secured later.

As described above, in this embodiment, the rib-shaped protrusions 45 are provided to protrude at the four inner surfaces of the connector holding guide portion 40, and brought in pressure contact with, that is, brought in line contact with the outer surface of the upper portion (flange portion 53) of the fan-side connector 50 when the fan-side connector 50 is fitted, thereby increasing a contact pressure to hold the fan-side connector 50. Therefore, retention stability and fittability are improved compared with a case where the fan-side connector 50 is held by surface contact without providing the rib-shaped protrusion 45. However, it is not necessarily required to have the configuration described above. A plurality of rib-shaped protrusions extending in the depth direction of the connector holding guide portion 40 may be provided at the outer surface of (for example, the flange portion 53 of) the fan-side connector 50 so as to be brought in pressure contact with the inner surface of the connector holding guide portion 40 when the fan-side connector 50 is fitted.

To cover the air cooling fan 25, the heat radiating fins 22, the wiring housing groove 31, the through-hole 35, the fan wiring 28 (part exposed from the base housing 20 thereof), and the like provided at the base housing 20, a cover 55 having a rectangular flat plate shape is provided and screwed. The cover 55 is provided with a ventilation hole 55a of a circular hole corresponding to the air suction opening 25a of the fan 25.

Figure 13:
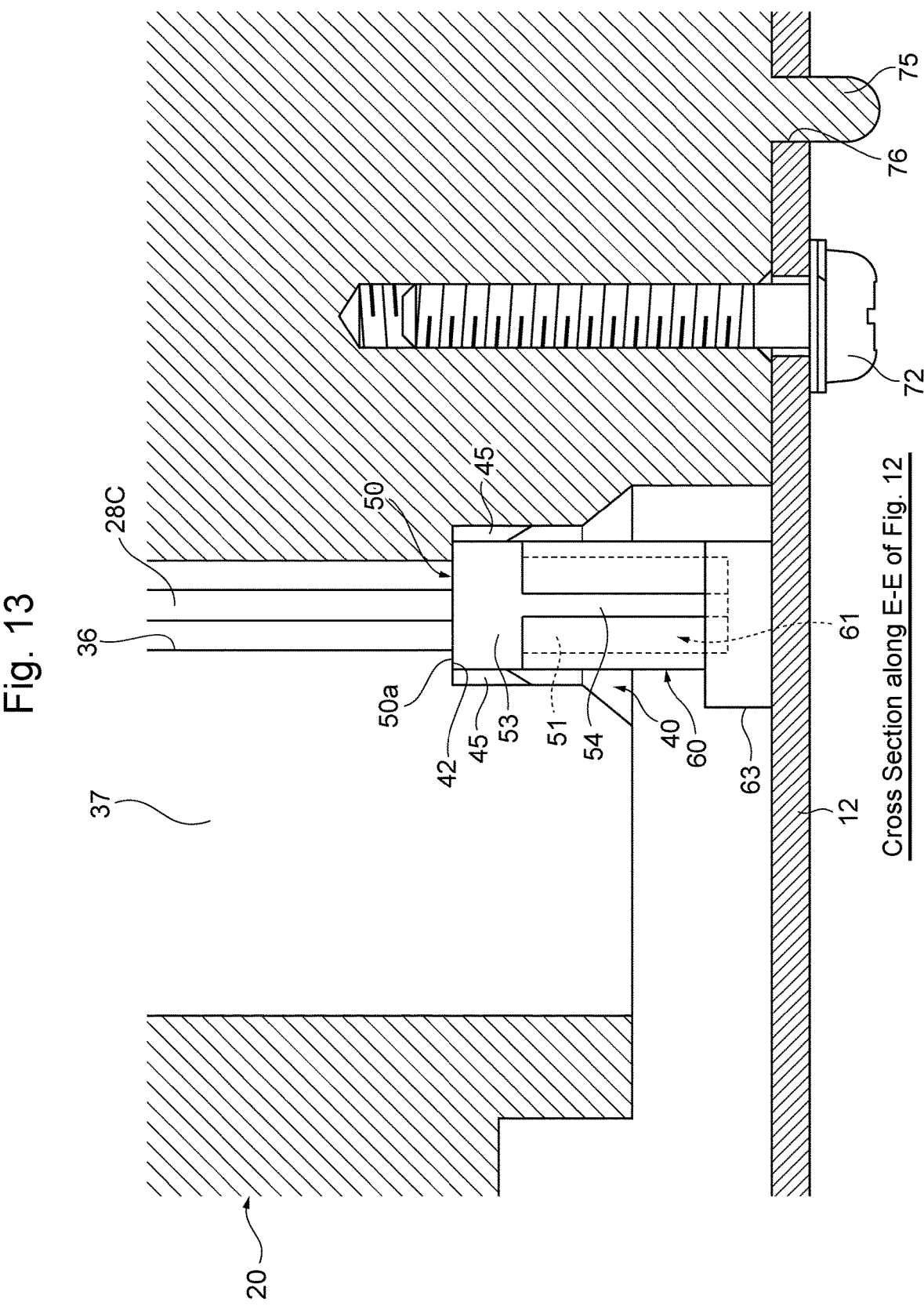
FIG. 13 is a cross-sectional view along an arrow line E-E of FIG. 12 (for the connector, non-cross section).

Here, in this embodiment, the substrate 12 is positioned with respect to the base housing 20, as illustrated in FIG. 13, for example, using positioning bosses 75 and holes 76 provided at a plurality of positions of the base housing 20 and the substrate 12. The substrate 12 is assembled and secured to the base housing 20 by, as illustrated in FIG. 13, for example, fastening the base housing 20 to the substrate 12 with screw members 72 at appropriate positions thereof. To improve the position accuracy of fitting the fan-side connector 50 to the substrate-side connector 60, the positioning boss 75 and the hole 76 may be provided near the fitting position thereof (FIG. 13).

Then, in this embodiment, the position, the dimensions, and the shape of the connector holding guide portion 40 are set in advance such that the substrate-side connector 60 provided at the substrate 12 overlaps with the fan-side connector 50 held by the connector holding guide portion 40 in an orthographic projection perpendicular to the substrate 12 in a state where the substrate 12 is positioned to the base housing 20, and the fan-side connector 50 is fitted to the substrate-side connector 60 to a required fitting depth (a required fitting depth is obtained between the fan-side connector 50 and the substrate-side connector 60) in a state where the substrate 12 is assembled and secured to the base housing 20.

More specifically, when the substrate 12 is positioned and assembled to be secured to the base housing 20, (for example, an upper end surface 50a of) the fan-side connector 50 held by the connector holding guide portion 40 is relatively pushed by (for example, the ceiling surface 42 opposed to the substrate 12 of) the connector holding guide portion 40, and fitted to the substrate-side connector 60 to the required fitting depth.

(Fitting Work of Fan-Side Connector 50 to Substrate-Side Connector 60)

An assembly work of the electronic control device 10 of this embodiment having the configuration as described above, especially a fitting work of the fan-side connector 50 to the substrate-side connector 60 is performed, for example, as described below.

Figure 11:
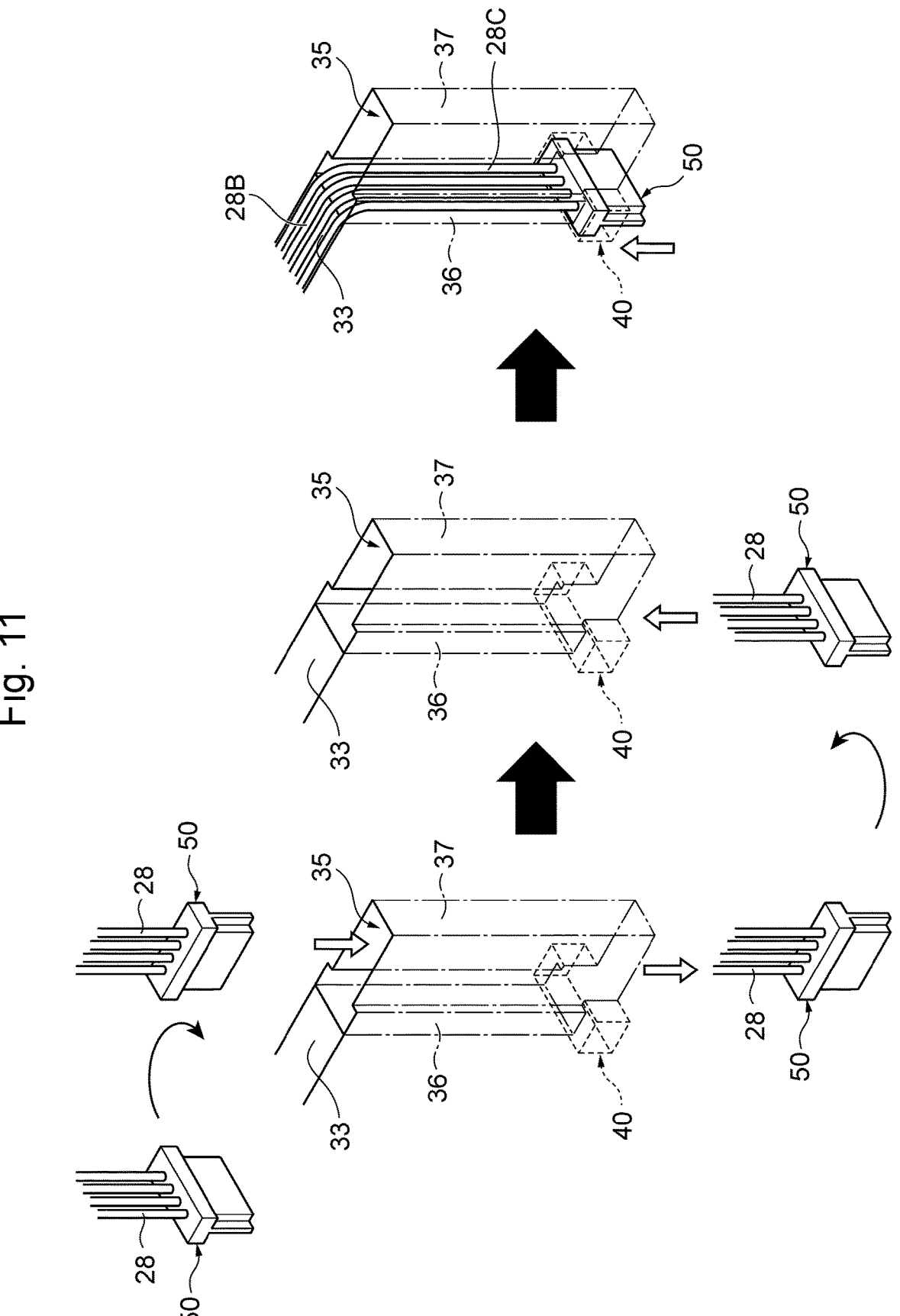
FIG. 11 is a schematic perspective view for describing the fan-side connector of the electronic control device illustrated in FIG. 1 passed through a through-hole and fitted to a connector holding guide portion.

First, the predetermined number of (four) lead wires constituting the fan wiring 28 are adjacently aligned to form a flat strip shape using the wiring rectification groove 33 of the wiring housing groove 31 of the wiring passage 30 and the like, and the fan-side connector 50 not twisted with respect to the strip-shaped portion (strip-shaped wiring portion 28B, strip-shaped hanging portion 28C) is turned in one direction by approximately 90 degrees to allow the fan-side connector 50 to pass through the through-hole 35 (connector through-hole 37) as illustrated in the left diagram of FIG. 11. Subsequently, after passing through the through-hole 35 (connector through-hole 37) from the upper side to the lower side, as illustrated in a center diagram of FIG. 11, the fan-side connector 50 is turned in an opposite direction (opposite direction of the one direction) by approximately 90 degrees, thereby returning the fan-side connector 50 to the state not twisted with respect to the strip-shaped portion (strip-shaped wiring portion 28B, strip-shaped hanging portion 28C). In this state, the fan-side connector 50 is fitted to the connector holding guide portion 40 from the back surface side (lower side) and held as illustrated in a right diagram of FIG. 11. The fitting of the fan-side connector 50 may be performed by pushing up from the lower side, and may be performed by pulling up with the fan wiring 28 from the upper side.

When the fan-side connector 50 is fitted to the connector holding guide portion 40 (left diagram of FIG. 12) from the back surface side (lower side) and held, it is ideal to push the fan-side connector 50 until the upper end surface 50a of (the flange portion 53 of) the fan-side connector 50 is brought in contact with the ceiling surface 42 (a lock surface that relatively presses the fan-side connector 50) of the connector holding guide portion 40. However, as illustrated in a center diagram of FIG. 12, even in a case where the upper end surface 50a is not in contact with the ceiling surface 42, and a gap Sa is formed between the upper end surface 50a and the ceiling surface 42, when the substrate 12 is positioned and assembled to be secured to the base housing 20, the base housing 20 relatively approaches the substrate 12. Accordingly, while the fan-side connector 50 is fitted to the substrate-side connector 60, the ceiling surface 42 of the connector holding guide portion 40 becomes close to and in contact with the upper end surface 50a, and the ceiling surface 42 of the connector holding guide portion 40 presses the upper end surface 50a.

Therefore, even in this case, when the substrate 12 is positioned and assembled to be secured to the base housing 20, as illustrated in a right diagram of FIG. 12, for example, a spaced distance from the surface of the substrate 12 to the upper end surface 50a of the fan-side connector 50 (the ceiling surface 42 of the connector holding guide portion 40) becomes a preliminarily determined distance La, and the fitting depth of the fan-side connector 50 to the substrate-side connector 60 becomes a required fitting depth Ka.

Thus, in the electronic control device 10 of this embodiment, the base housing 20 is provided with the through-hole 35 (36, 37) that allows the fan wiring 28 and the fan-side connector 50 to pass through from the front surface side to the back surface side (substrate 12 side), and the connector holding guide portion 40 to which the fan-side connector 50 with the fan wiring 28 that has passed through the through-hole 35 (36, 37) is fitted from the back surface side (substrate 12 side) and held. The position, the dimensions, and the shape of the connector holding guide portion 40 are set in advance in the design stage such that the substrate-side connector 60 provided at the substrate 12 overlaps with the fan-side connector 50 held by the connector holding guide portion 40 in an orthographic projection perpendicular to the substrate 12 in the state where the substrate 12 is positioned to the base housing 20, and the fan-side connector 50 is fitted to the substrate-side connector 60 to the required fitting depth (the required fitting depth is obtained between the fan-side connector 50 and the substrate-side connector 60) in the state where the substrate 12 is secured to the base housing 20.

Therefore, when the substrate 12 is positioned and assembled to be secured to the base housing 20, the base housing 20 relatively approaches the substrate 12. In association with this, for example, the upper end surface 50a of the fan-side connector 50 held by the connector holding guide portion 40 is relatively pushed to the substrate 12 side by, for example, the ceiling surface 42 of the connector holding guide portion 40, and appropriately fitted to the substrate-side connector 60 to the required fitting depth.

Thus, in the electronic control device 10 of this embodiment, when the substrate 12 is positioned and secured to the base housing 20, simultaneously, the substrate-side connector 60 is fitted to and electrically connected to the fan-side connector 50. Therefore, the fitting work of the fan-side connector 50 to the substrate-side connector 60 can be efficiently and reliably performed in a facilitated manner without increasing the number of components or causing a failure, such as a poor fitting (poor electrical connection), and as a result, the improvement of assembly workability, the labor-saving, the cost reduction, and the like can be effectively attempted.

The through-hole 35 (36, 37) having the T-shaped hole shape in plan view allows visual confirmation of the fitting portion of the fan-side connector 50 to the substrate-side connector 60 and the like from the front surface of side of the base housing 20. Therefore, for example, at the positioning of the base housing 20 and the substrate 12, a flathead screwdriver or the like can be inserted through the T-shaped through-hole 35 to assist the proper fitting of the fan-side connector 50 to the substrate-side connector 60, and the fan-side connector 50 can be pushed to obtain the required fitting depth in a case of insufficient fitting.

When the connector has a lock function (lock claw), the lock claw preferably opens to the longitudinal bar portion side of the T-shaped through-hole 35 to avoid the interference with the base housing 20. Similarly to the above, the T-shaped through-hole 35 can be used for locking and releasing thereof.

The widths of the wiring rectification groove 33 and the wiring through-hole 36 are approximately same as the width of the strip-shaped wiring portion 28B, and in the state where the fan-side connector 50 is fitted to the connector holding guide portion 40 from the back surface side (lower side) and held, as described above, the fan-side connector 50 is returned to the state not twisted with respect to the strip-shaped wiring portion 28B and the strip-shaped hanging portion 28C. Therefore, the rectification (styling) of the fan wiring 28 can be facilitated.

While the ceiling surface 42 of the connector holding guide portion 40 is used as the lock surface that presses the fan-side connector 50 in the above-described embodiment, a lock surface may be additionally provided. When the flange portion (shoulder portion) 53 as described in the above embodiment is not provided as the fan-side connector, it is only necessary to press the upper end surface 50a excluding the fan wiring 28 part of the housing 51 of the fan-side connector 50.

Next, modifications in which the fan-side connector 50 is configured to be reliably fitted to the substrate-side connector 60 when the fitting of the fan-side connector 50 to the substrate-side connector 60 is insufficient in the above-described embodiment will be described with reference to FIG. 14, FIG. 15A, FIG. 15B, and FIG. 15C.

Figure 14:
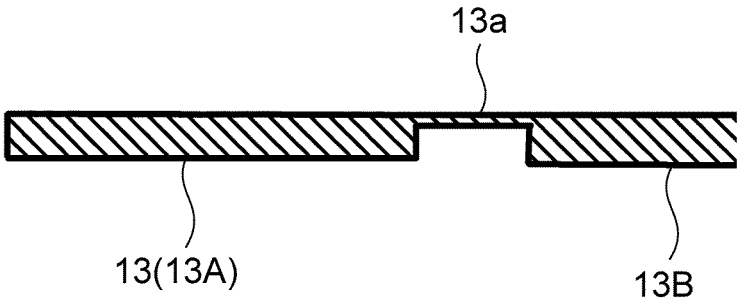
FIG. 14 is a cross-sectional view for describing a glass epoxy substrate used in a modification in which the substrate is configured to be pressed until the fan-side connector is reliably fitted to the substrate-side connector.
Figure 15A:
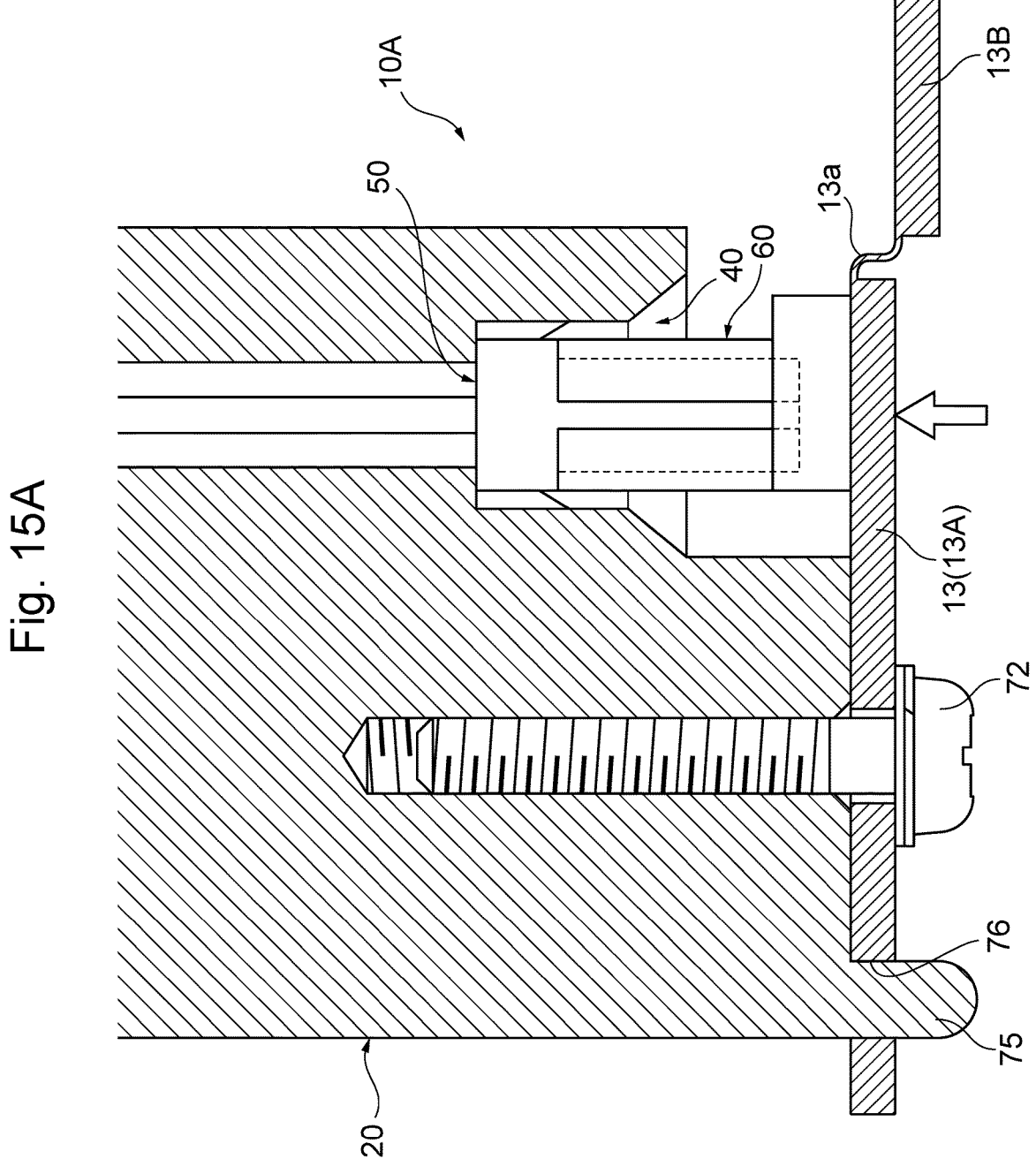
FIG. 15A is a cross-sectional view for describing a modification (No. 1) in which the substrate is configured to be pressed until the fan-side connector is reliably fitted to the substrate-side connector.
Figure 15B:
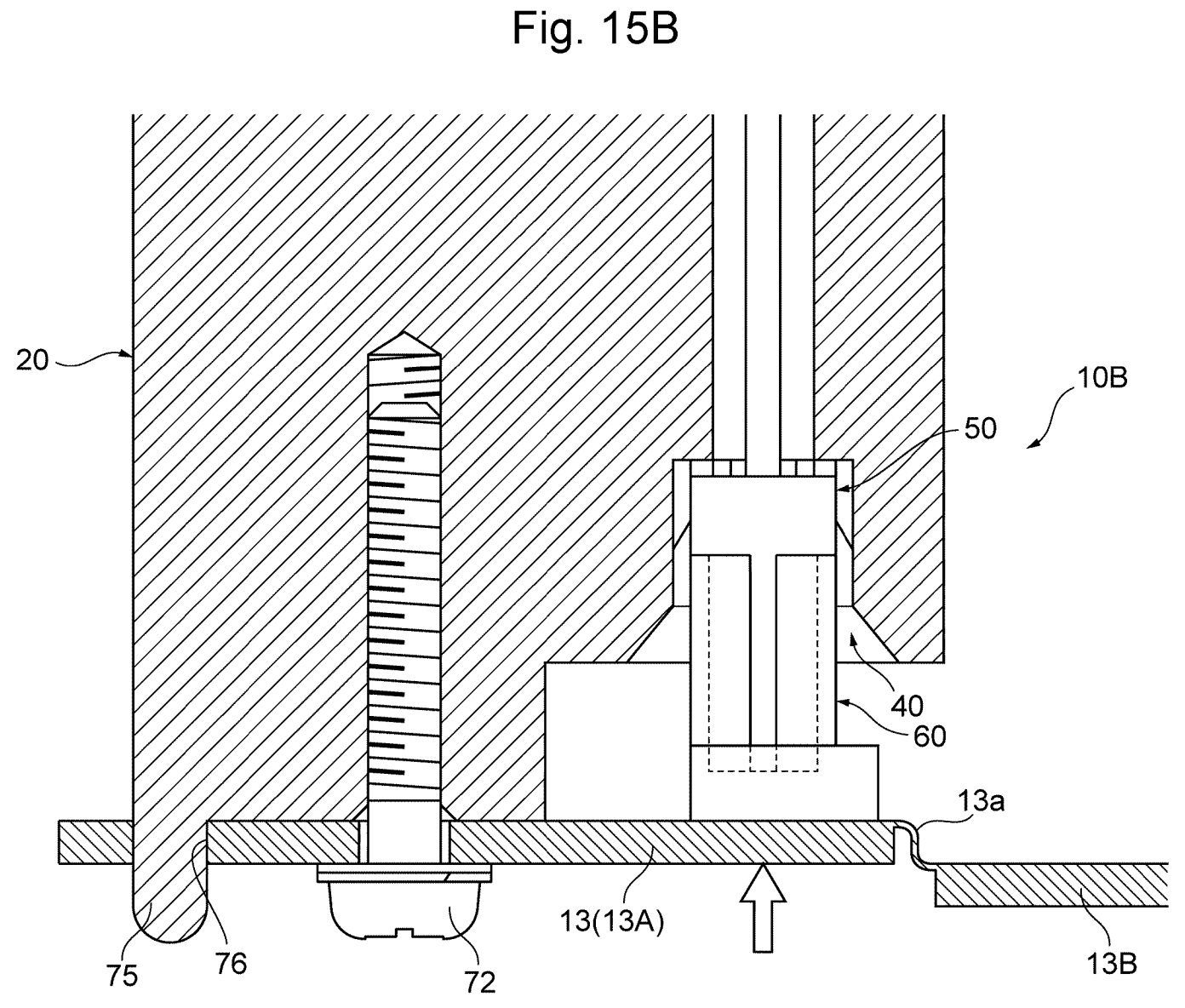
Figure 15C:
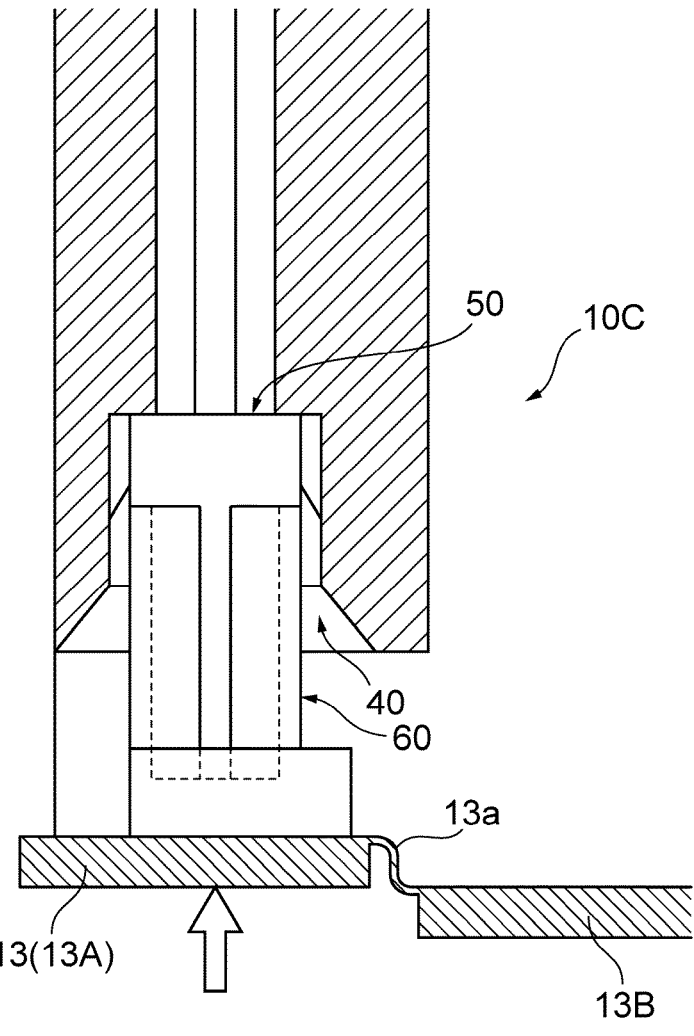
FIG. 15C is a cross-sectional view for describing a modification (No. 3) in which the substrate is configured to be pressed until the fan-side connector is reliably fitted to the substrate-side connector.

In main parts of electronic control devices 10A, 10B, and 10C illustrated in FIG. 15A, FIG. 15B, and FIG. 15C, same reference numerals are attached to parts corresponding to respective parts (other than the substrate 12) of FIG. 13 of the above-described embodiment. In the electronic control devices 10A, 10B, and 10C illustrated in FIG. 15A, FIG. 15B, and FIG. 15C, an elastically deformable glass epoxy substrate 13 with a thin portion 13a, as illustrated in FIG. 14, to increase flexibility is used as the wiring substrate. Basically, the substrate 13 can be partially pushed to the base housing 20 side until the fan-side connector 50 is reliably fitted to the substrate-side connector 60.

In the example illustrated in FIG. 15A, when the fitting of the fan-side connector 50 to the substrate-side connector 60 is insufficient regardless of securing of the substrate 13 to the base housing 20 by fastening with the screw member 72, as indicated by a void arrow, near the lower side of the substrate-side connector 60, that is, a part close to the thin portion 13a of a part 13A in the substrate-side connector 60 side with respect to the thin portion 13a of the substrate 13 is pressed upward. Accordingly, for example, the thin portion 13a is bent to push the part 13A in the substrate-side connector 60 side with respect to the thin portion 13a of the substrate 13 upward with respect to a part 13B other than the substrate-side connector 60 side, and the substrate-side connector 60 disposed at the substrate 13 is pushed into the fan-side connector 50 held by the connector holding guide portion 40, thus providing the appropriate fitting state.

In the example illustrated in FIG. 15B, after the substrate 13 is positioned to the base housing 20 using the boss 75 and the like, before screwing with the screw member 72, as indicated by a void arrow, a part close to the thin portion 13*a* of a part 13A in the substrate-side connector 60 side with respect to the thin portion 13*a* of the substrate 13 is pressed upward. Accordingly, for example, the thin portion 13*a* is bent to push the part 13A in the substrate-side connector 60 side with respect to the thin portion 13*a* of the substrate 13 upward with respect to a part 13B other than the substrate-side connector 60 side, and the substrate-side connector 60 disposed at the substrate 13 is pushed into the fan-side connector 50 held by the connector holding guide portion 40, thus providing the appropriate fitting state. Then, the substrate 13 is secured to the base housing 20 by fastening with the screw member 72.

In the example illustrated in FIG. 15C, when the screw member 72 used in the above-described example is not used, and the fitting of the fan-side connector 50 to the substrate-side connector 60 is insufficient, as indicated by a void arrow, a part 13A in the substrate-side connector 60 side with respect to the thin portion 13*a* of the substrate 13 is pressed upward. Accordingly, for example, the thin portion 13*a* is bent to push the part 13A in the substrate-side connector 60 side with respect to the thin portion 13*a* of the substrate 13 upward with respect to a part 13B other than the substrate-side connector 60 side, and the substrate-side connector 60 disposed at the substrate 13 is pushed into the fan-side connector 50 held by the connector holding guide portion 40, thus providing the appropriate fitting state.

(Configuration to Suppress Mixing of Foreign Substances (Contamination) into Substrate from Air Cooling Fan 25 Via Wiring)

Subsequently, a measure to avoid mixing of foreign substances (contamination) into the substrate via the wiring passage 30 caused by air sending by the air cooling fan 25 will be described with some examples.

As described based on FIG. 5, the air discharged directly below from the air cooling fan 25 flows through the heat radiating fins 22 that become high temperature, and when suppression of the mixing of foreign substances (contamination) into the substrate from the air cooling fan 25 via the wiring is insufficient, the air flows along the wiring housing groove 31 (32, 33) through the wiring outlet portion 34 of the fan 25, and flows to also the substrate side passing through the through-hole 35 (36, 37) (see FIG. 3, FIG. 4). In this case, foreign substances are possibly mixed into the substrate due to the air sending by the air cooling fan 25.

Figure 16:
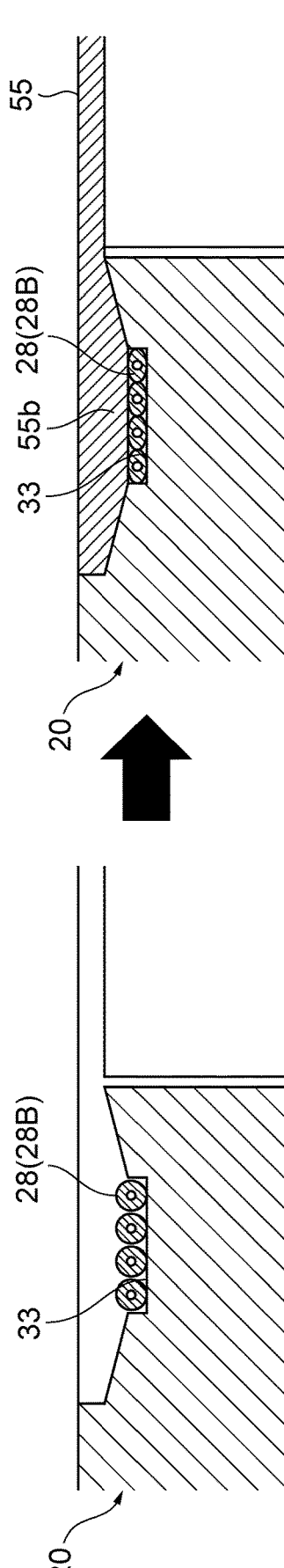
FIG. 16 is a cross-sectional view for describing an example of a measure to avoid mixing of foreign substances (contamination) into the substrate due to air sending by the fan by pressing a fan wiring with a cover in the electronic control device illustrated in FIG. 1.

In the example illustrated in FIG. 16, as illustrated in a left diagram of FIG. 16, the depth of the wiring rectification groove 33 is shallower than the diameters of the predetermined number of (four) lead wires constituting the strip-shaped wiring portion 28B, and as illustrated in a right diagram of FIG. 16, the cover 55 is provided with a thick projecting portion 55*b* as a pressing projecting portion that partially presses the strip-shaped wiring portion 28B on the wiring rectification groove 33.

In this example, by attaching the cover 55 to the base housing 20, a part of the strip-shaped wiring portion 28B is pressed against the wiring rectification groove 33 by the thick projecting portion (pressing projecting portion) 55*b* of the cover 55. Therefore, the coated portion with elasticity and flexibility made of a synthetic resin of the predetermined number of (four) lead wires constituting the strip-shaped wiring portion 28B is squashed, and as illustrated in the right diagram of FIG. 16, the lead wires, the lead wires and the wiring rectification groove 33, and the lead wires and the thick projecting portion 55*b* of the cover 55 are mutually brought in close contact, thus reducing the gaps between the lead wires, and between the lead wires, the wiring rectification groove 33, and the thick projecting portion 55*b* of the cover 55. Accordingly, the pressure loss of the wiring passage 30 increases, and therefore, the contamination of the substrate via the wiring passage 30 caused by the air sending by the air cooling fan 25 can be suppressed.

Figure 17:
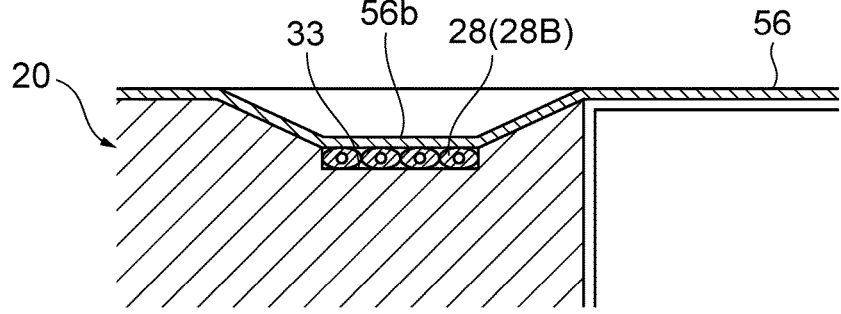
FIG. 17 is a cross-sectional view for describing another example of the measure to avoid mixing of foreign substances (contamination) into the substrate due to air sending by the fan by pressing the fan wiring with the cover in the electronic control device illustrated in FIG. 1.

In the example illustrated in FIG. 17, similarly to the example illustrated in FIG. 16, the depth of the wiring rectification groove 33 is shallower than the diameters of the predetermined number of (four) lead wires constituting the strip-shaped wiring portion 28B, and a sheet metal cover 56 is provided with a groove-shaped recessed portion 56*b* formed by drawing process as a pressing projecting portion that partially presses the strip-shaped wiring portion 28B on the wiring rectification groove 33. The cover 56 is not limited to one made of a sheet metal, and may be one made of a resin.

Also in this example, by attaching the cover 56 to the base housing 20, a part of the strip-shaped wiring portion 28B is pressed against the wiring rectification groove 33 by the groove-shaped recessed portion (pressing projecting portion) 56*b* of the cover 56. Accordingly, an operational advantage approximately similar to that of the example illustrated in FIG. 16 is obtained. In this example, the groove-shaped recessed portion 56*b* also serves as a reinforcing portion.

Figure 18:
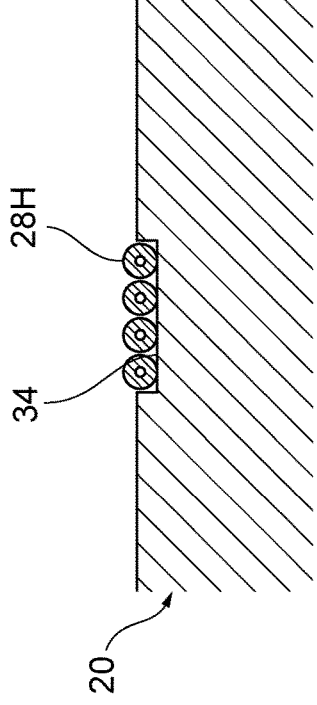
FIG. 18 is a cross-sectional view of a part corresponding to a cross-sectional view along an arrow line F-F of FIG. 3 for describing an example of a measure to avoid mixing of foreign substances (contamination) into the substrate due to air sending by the fan by pressing a strip-shaped wiring portion with the cover at a wiring outlet portion of the fan in the electronic control device illustrated in FIG. 1.

In the example illustrated in FIG. 18, the base housing 20 is provided with a groove-shaped wiring outlet portion 34 shallower than the diameter of the lead wire (see FIG. 3 of the above-described embodiment). On the wiring outlet portion 34, to extract the fan wiring 28 from the fan 25 to the wiring housing groove 31, the predetermined number of (four) lead wires constituting the fan wiring 28 are adjacently aligned to form a flat strip-shaped wiring portion 28H. By attaching the cover 55 to the base housing 20, the flat strip-shaped wiring portion 28H is pressed against the wiring outlet portion 34 by the cover 55, thus reducing the gaps between the predetermined number of (four) lead wires constituting the flat strip-shaped wiring portion 28H, and between the lead wires, the wiring outlet portion 34, and the cover 55. Accordingly, the pressure loss of the wiring passage 30 increases, and therefore, the contamination of the substrate via the wiring passage 30 caused by the air sending by the air cooling fan 25 can be suppressed.

Figure 19:
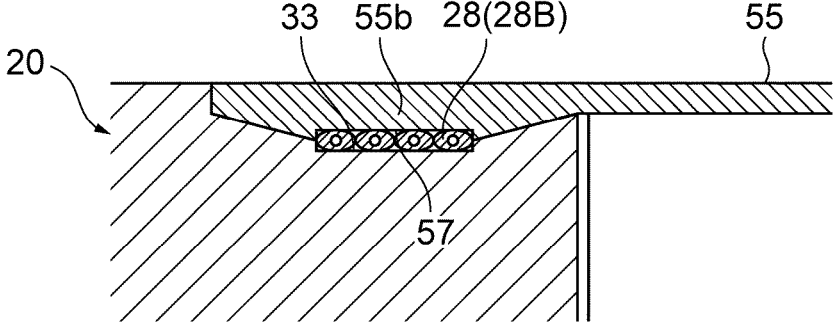
FIG. 19 is a cross-sectional view for describing further another example of the measure to avoid mixing of foreign substances (contamination) into the substrate due to air sending by the fan by pressing the fan wiring with the cover in the electronic control device illustrated in FIG. 1.
Figure 20:
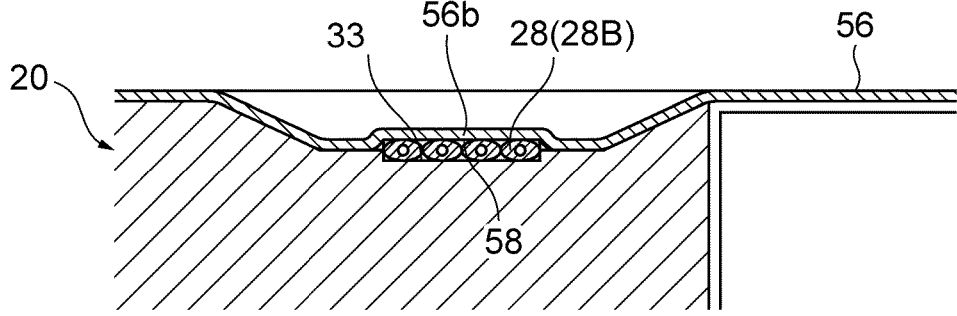
FIG. 20 is a cross-sectional view for describing still another example of the measure to avoid mixing of foreign substances (contamination) into the substrate due to air sending by the fan by pressing the fan wiring with the cover in the electronic control device illustrated in FIG. 1.

In the examples illustrated in FIG. 16, FIG. 17, and FIG. 18, together with the wiring rectification groove 33 and the wiring outlet portion 34 in the wiring passage 30 side of the base housing 20, or instead of the wiring rectification groove 33 and the wiring outlet portion 34, a wiring rectification groove to adjacently align the predetermined number of (four) lead wires constituting the fan wiring 28 may be provided at a surface in the wiring passage 30 side of the cover 55 (56). FIG. 19 illustrates an example in which (the thick projecting portion 55*b* of) the cover 55 in the example illustrated in FIG. 16 is provided with a wiring rectification groove 57 similar to the wiring rectification groove 33. FIG. 20 illustrates an example in which (the groove-shaped recessed portion 56*b* of) the cover 56 in the example illustrated in FIG. 17 is provided with a wiring rectification groove 58 similar to the wiring rectification groove 33.

Figure 21:
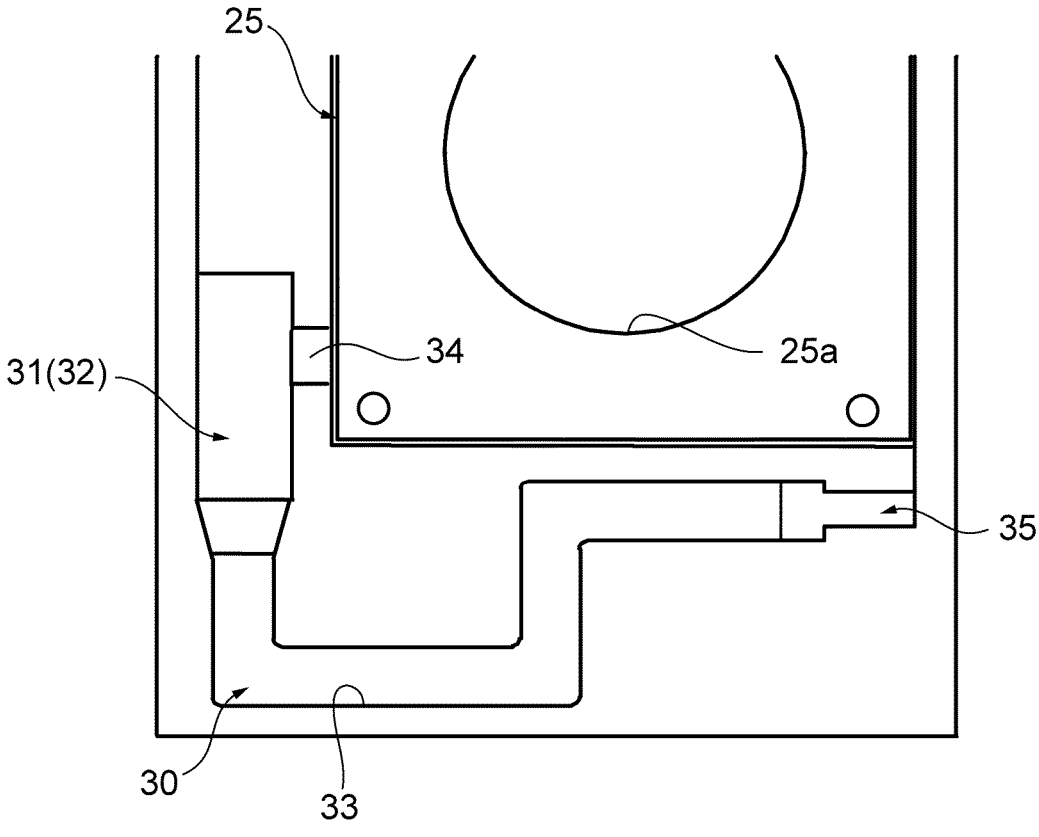
FIG. 21 is a plan view for describing an example of a measure to avoid mixing of foreign substances (contamination) into the substrate due to air sending by the fan by bending a wiring rectification groove in the electronic control device illustrated in FIG. 1.

While the wiring rectification groove 33 illustrated in FIG. 3 of the above-described embodiment is formed in a straight line in plan view over approximately the entire length, the wiring rectification groove 33 is bent in a U shape or a key shape in plan view in the example illustrated in FIG. 21. Bending the wiring rectification groove 33 as described above also increases a passage resistance of the wiring passage 30 to increase the pressure loss, therefore, the contamination of the substrate via the wiring passage 30 caused by the air sending by the air cooling fan 25 can be suppressed.

Figure 22:
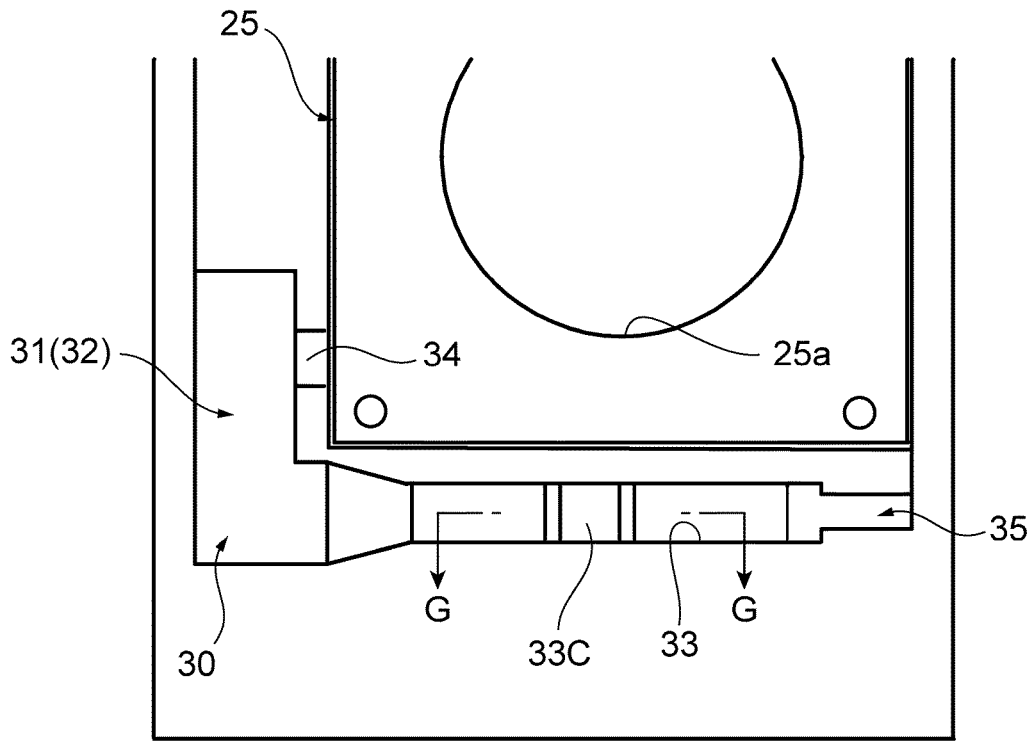
FIG. 22 is a plan view for describing an example of a measure to avoid mixing of foreign substances (contamination) into the substrate due to air sending by the fan by partially deepening the wiring rectification groove and also pressing the wiring of the deepened part with the cover in the electronic control device illustrated in FIG. 1.
Figure 23:
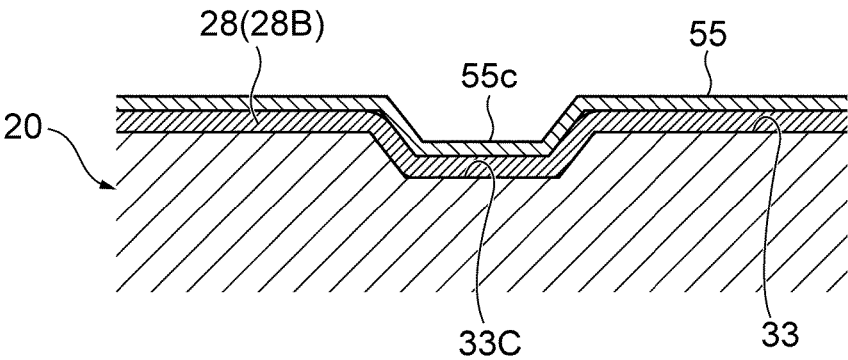
FIG. 23 is a cross-sectional view along an arrow line G-G of FIG. 22.

While (the bottom surface of) the wiring rectification groove 33 illustrated in FIG. 3 of the above-described embodiment is formed to be flat over approximately the entire length, in the examples illustrated in FIG. 22 and FIG. 23, (the bottom surface of) the wiring rectification groove 33 is partially deepened, and to press the fan wiring 28 in a deepened part 33C by the cover 55 similarly to other parts, the cover 55 is provided with a groove-shaped recessed portion 55c formed by a bending work (FIG. 23). Also with this configuration, the passage resistance of the wiring passage 30 increases to increase the pressure loss, therefore, the contamination of the substrate via the wiring passage 30 caused by the air sending by the air cooling fan 25 can be suppressed.

In the electronic control device 10 of this embodiment described above, as the method to avoid the mixing of foreign substances (contamination) from the air cooling fan (blower) 25 via the wiring, the base housing 20 between the air cooling fan (blower) 25 and the wiring substrate 12 is provided with the wiring rectification groove 33 constituting the wiring passage 30. (The predetermined number of (four) of lead wires constituting the strip-shaped wiring portion 28B of) the fan wiring 28 is housed in the wiring rectification groove 33, and (the predetermined number of (four) lead wires constituting the strip-shaped wiring portion 28B of) the fan wiring 28 is pressed against the wiring rectification groove 33 by the cover 55, thereby configuring the gap in the wiring passage 30 to be small to the extent that there is no practical problem. Further, coating of (the predetermined number of (four) lead wires constituting the strip-shaped wiring portion 28B of) the fan wiring 28 is squashed to further reduce the gap, thus causing the pressure loss to allow avoiding the contamination of the wiring substrate 12 due to the air sending by the air cooling fan (blower) 25.

Further, the base housing 20 is provided with the through-hole 35 (36, 37) through which the fan-side connector 50 of the fan wiring 28 connecting the air cooling fan (blower) 25 to the wiring substrate 12 passes, and the connector holding guide portion 40 to fit the fan-side connector 50 to the base housing 20 after the fan-side connector 50 passes through the through-hole 35 (36, 37). The fan-side connector 50 is secured to the connector holding guide portion 40 at the position perpendicularly overlapping with the substrate-side connector 60 such that the fan-side connector 50 is fitted to the substrate-side connector 60 on the substrate 12 when the substrate 12 is assembled to be secured.

Therefore, by devising the shape and the configuration of the existing base housing and cover, the electronic control device 10 of this embodiment can attempt to avoid the mixing of foreign substances (contamination) from the air cooling fan (blower) 25 via the wiring without adding or increasing a component and a subsidiary material for locking with an elastic material, application of a sealing material, and the like on the wiring part from the air cooling fan (blower) 25 to the wiring substrate 12.

Further, the base housing 20 is provided with the through-hole 35 (36, 37) through which the fan-side connector 50 of the fan wiring 28 passes, and the shape (connector holding guide portion 40) for fitting and securing the fan-side connector 50 at the position of being fitted to the substrate-side connector 60 on the substrate 12 when the substrate 12 is assembled to be secured after the fan-side connector 50 passes through the through-hole 35 (36, 37). Accordingly, since the fitting work of the connector ends simultaneously with the assembly work of the substrate 12, the satisfactory workability is provided.

That is, to avoid the mixing of foreign substances (contamination), the fan wiring 28 in the wiring passage 30 from the air cooling fan (blower) 25 to the wiring substrate 12 is pressed to suppress the air flow, and simultaneously, the fan-side connector 50 is secured at the fitting position with the substrate-side connector 60 on the substrate 12 by (the connector holding guide portion 40 of) the base housing 20, thus allowing efficiently performing the fitting work of the connector.

While the embodiments of the present invention are described above in detail, the present invention is not limited to the above-described embodiments, and various variations are included. For example, the above-described embodiments have been described in detail for describing the present invention in an easy-to-understand manner and are not necessarily limited to one that includes all the described configurations. Other aspects within a range of the technical idea of the present invention are included in the present invention. A part of the configuration in one embodiment can be replaced by a configuration in another embodiment, and the configuration in another embodiment can be added to the configuration in one embodiment. Further, addition, deletion, and replacement of another configuration can be performed on a part of the configuration in each embodiment.

REFERENCE SIGNS LIST

10 Electronic control device
12 Wiring substrate (substrate)
14 Connector
20 Base housing
22 Heat radiating fin (fin)
25 Air cooling fan (blower)
25a Air suction opening
28 Fan wiring (blower wiring)
28A Base end side loose portion
28B Strip-shaped wiring portion
28C Strip-shaped hanging portion
28H Strip-shaped wiring portion
30 Wiring passage
31 Wiring housing groove
32 Base end side housing groove
33 Wiring rectification groove
34 Wiring outlet portion
35 Through-hole
36 Wiring through-hole
37 Connector through-hole
40 Connector holding guide portion
42 Ceiling surface
45 Rib-shaped protrusion
50 Fan-side connector (blower-side connector)
50a Upper end surface
51 Housing
52 Contact member (socket)
53 Flange portion
54 Ridge portion
55 Cover
55a Ventilation hole

US 12,666,562 B2

15

55b Thick projecting portion (pressing projecting portion)
56 Cover
56b Groove-shaped recessed portion (pressing projecting portion)
60 Substrate-side connector
61 Recess
62 Contact member (pin)
63 Flange portion
72 Screw member
75 Positioning boss
76 Hole

The invention claimed is:

1. An electronic control device comprising:
a substrate including a heat generating electronic component;
a base housing to which the substrate is positioned and secured;
a fin provided at an opposite surface of a surface opposed to the heat generating electronic component of the base housing;
a blower disposed at the base housing to send a cooling air to the fin;
a blower wiring that electrically connects the blower to the substrate; and
a cover that covers at least a part exposed from the base housing of the blower wiring,
wherein the blower wiring has a distal end portion provided with a blower-side connector, and the substrate is provided with a substrate-side connector fitted to the blower-side connector,
wherein the base housing is provided with a wiring passage including a wiring housing groove and a through-hole for routing the blower-side connector with the blower wiring from a front surface side to a back surface side, the base housing is provided with a connector holding guide portion to which the blower-side connector after passing through the through-hole is fitted from the back surface side and held, and
wherein in a state where the substrate is positioned to the base housing, the substrate-side connector disposed at the substrate overlaps with the blower-side connector held by the connector holding guide portion in an orthographic projection perpendicular to the substrate, and in a state where the substrate is secured to the base housing, the blower-side connector is fitted to the substrate-side connector to a required fitting depth.

2. The electronic control device according to claim 1,
wherein when the substrate is positioned and secured to the base housing, the blower-side connector held by the connector holding guide portion is relatively pushed by the connector holding guide portion to be fitted to the substrate-side connector to the required fitting depth.

3. The electronic control device according to claim 1,
wherein the connector holding guide portion is provided to be continuous with a lower end portion of the through-hole, configured of a hole with a ceiling surface having an open lower face, and holds the blower-side connector fitted from the lower face side in a posture perpendicular to the substrate.

4. The electronic control device according to claim 3,
wherein a rib-shaped protrusion extending in a depth direction of the connector holding guide portion is provided to protrude in the ceiling surface side of the connector holding guide portion so as to be brought in pressure contact with the blower-side connector.

5. The electronic control device according to claim 2,
wherein a lock surface to relatively press the blower-side connector is provided at the connector holding guide portion.

6. The electronic control device according to claim 1,
wherein the blower-side connector includes a housing internally including contact members side by side to which a predetermined number of lead wires constituting the blower wiring are connected, and the housing is provided with a flange portion projecting outward.

7. The electronic control device according to claim 1,
wherein a part of the wiring housing groove is configured as a wiring rectification groove having a bottom surface on which a predetermined number of lead wires constituting the blower wiring are adjacently aligned to form a flat strip-shaped wiring portion.

8. The electronic control device according to claim 7,
wherein the strip-shaped wiring portion is pressed against the wiring rectification groove by the cover to reduce gaps between the predetermined number of lead wires constituting the strip-shaped wiring portion, and between the lead wires, the wiring rectification groove, and the cover.

9. The electronic control device according to claim 7,
wherein the blower-side connector not twisted with respect to the strip-shaped wiring portion is allowed to pass through the through-hole by turning the blower-side connector in one direction by a predetermined angle, the blower-side connector is returned to the state not twisted with respect to the strip-shaped wiring portion by turning the blower-side connector in an opposite direction by a predetermined angle after passing through the through-hole, and the blower-side connector is allowed to be fitted to the connector holding guide portion and held in the state.

10. The electronic control device according to claim 7,
wherein the through-hole is provided at a distal end side of the wiring rectification groove, has a T-shaped hole shape in plan view, includes a lateral bar part as a wiring through-hole having a width approximately same as a width of the strip-shaped wiring portion, and includes a longitudinal bar part as a connector through-hole having a shape shorter than the lateral bar part of the wiring through-hole while allowing the blower-side connector to pass through the longitudinal bar part.

11. The electronic control device according to claim 1,
wherein a positioning boss to the substrate is provided to protrude close to a fitting position of the blower-side connector to the substrate-side connector at the base housing.

12. The electronic control device according to claim 1,
wherein the base housing is provided with a groove-shaped wiring outlet portion to extract the blower wiring from the blower to the wiring housing groove, a predetermined number of lead wires constituting the blower wiring are adjacently aligned to form a flat strip-shaped wiring portion at the wiring outlet portion, the strip-shaped wiring portion is pressed against the wiring outlet portion by the cover to reduce gaps between the predetermined number of lead wires constituting the strip-shaped wiring portion, and between the lead wires, the wiring outlet portion, and the cover.

13. The electronic control device according to claim 7,
wherein the wiring rectification groove is bent.

14. The electronic control device according to claim 7,
wherein the wiring rectification groove is partially deepened, and the blower wiring at the deepened part is pressed by the cover similarly to another part.

15. The electronic control device according to claim 1, wherein to allow the substrate to be partially pushed to the base housing side until the blower-side connector is reliably fitted to the substrate-side connector, an elastically deformable glass epoxy substrate is used as the substrate.

\* \* \* \* \*